(12) United States Patent
Fan et al.

(10) Patent No.: US 12,490,432 B2
(45) Date of Patent: Dec. 2, 2025

(54) METHOD OF FABRICATING A SEMICONDUCTOR DEVICE USING LASER ANNEALING

(71) Applicant: Yangtze Memory Technologies Co., Ltd., Hubei (CN)

(72) Inventors: Dongyu Fan, Wuhan (CN); Yuancheng Yang, Wuhan (CN); Kun Zhang, Wuhan (CN); Lei Liu, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 557 days.

(21) Appl. No.: 17/663,919

(22) Filed: May 18, 2022

(65) Prior Publication Data

US 2023/0180473 A1    Jun. 8, 2023

Related U.S. Application Data

(63) Continuation of application No. PCT/CN2021/135067, filed on Dec. 2, 2021.

(51) Int. Cl.
*H10B 43/27*    (2023.01)
*H01L 21/268*    (2006.01)
(Continued)

(52) U.S. Cl.
CPC ........... *H10B 43/27* (2023.02); *H01L 21/268* (2013.01); *H01L 21/324* (2013.01);
(Continued)

(58) Field of Classification Search
CPC . H01L 21/268; H01L 21/324; H01L 29/1033; H10B 41/27; H10B 41/35;
(Continued)

(56) References Cited

U.S. PATENT DOCUMENTS 5,852,497 A * 12/1998 Pramanik .................. G03F 9/70
356/51
8,273,610 B2 * 9/2012 Or-Bach ........... H01L 21/76898
257/E23.101

(Continued)

OTHER PUBLICATIONS

Korea Office Action issued on Mar. 25, 2024 in the corresponding Korean Application No. 10-2022-7044894, 5 pages.
(Continued)

*Primary Examiner* — Britt D Hanley
*Assistant Examiner* — Kevin Quinto
(74) *Attorney, Agent, or Firm* — Oblon, McClelland, Maier & Neustadt, L.L.P.

(57) ABSTRACT

Aspects of the disclosure provide a semiconductor device and a method to manufacture the semiconductor device. A channel hole is formed in a stack including alternating first layers and second layers. The stack is formed over a substrate of the semiconductor device. A gate dielectric layer and a channel layer are sequentially formed in the channel hole. Laser annealing is performed on the channel layer using laser light. An incidence angle of the laser light on an upper surface of the channel layer causes a total internal reflection to occur at an interface between the channel layer and the gate dielectric layer and an interface between the channel layer and an insulating layer that is adjacent to the channel layer.

19 Claims, 24 Drawing Sheets

(51) Int. Cl.
    *H01L 21/324* (2006.01)
    *H01L 29/10* (2006.01)
    *H10B 41/35* (2023.01)
    *H10B 41/48* (2023.01)
    *H10B 43/35* (2023.01)

(52) U.S. Cl.
    CPC ......... *H01L 29/1033* (2013.01); *H10B 41/35* (2023.02); *H10B 41/48* (2023.02); *H10B 43/35* (2023.02)

(58) Field of Classification Search
    CPC ........ H10B 41/48; H10B 43/27; H10B 43/35; H10D 62/235
    See application file for complete search history.

(56) References Cited

U.S. PATENT DOCUMENTS

| | | | |
|---|---|---|---|
| 9,397,111 | B1 | 7/2016 | Chowdhury et al. |
| 2005/0055016 | A1* | 3/2005 | Tanaka ............... B23K 26/0622 372/25 |
| 2008/0217685 | A1* | 9/2008 | Kim ..................... H10D 64/518 438/296 |
| 2011/0186851 | A1* | 8/2011 | Son ........................ H10B 43/27 257/66 |
| 2014/0264353 | A1* | 9/2014 | Lai .................... H01L 21/02595 438/266 |
| 2015/0179661 | A1* | 6/2015 | Huo .................. H01L 29/40117 257/315 |
| 2016/0233231 | A1* | 8/2016 | Lee ....................... H10B 43/35 |
| 2017/0110470 | A1 | 4/2017 | Rabkin et al. |
| 2019/0312049 | A1* | 10/2019 | Cheon ............... H01L 21/02274 |
| 2021/0066138 | A1* | 3/2021 | Mizumura ............ H01L 21/268 |
| 2021/0098490 | A1* | 4/2021 | Or-Bach ................ G11C 16/14 |

OTHER PUBLICATIONS

Extended European search report issued Feb. 7, 2025 in European Patent Application No. 21966039, 12 pages.

* cited by examiner

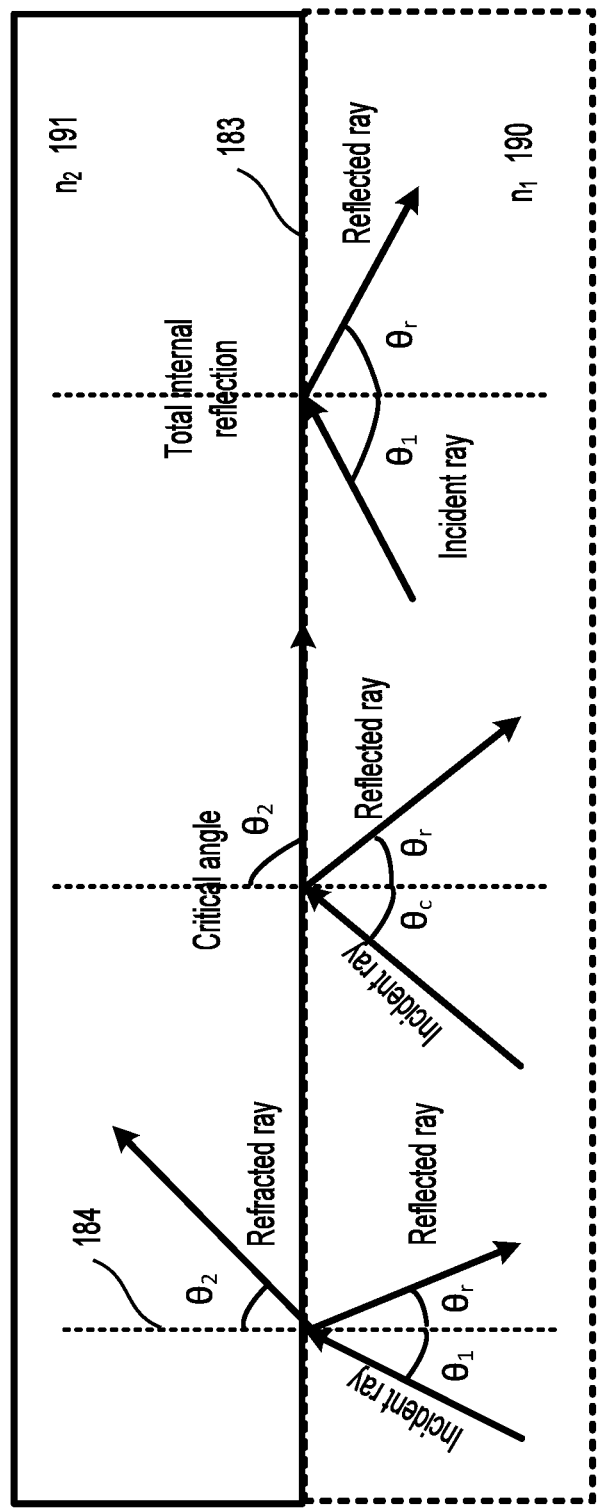

METHOD OF FABRICATING A SEMICONDUCTOR DEVICE USING LASER ANNEALING

CROSS-REFERENCE TO RELATED APPLICATIONS

This application is a continuation of International Application No. PCT/CN2021/135067, filed on Dec. 2, 2021, entitled "METHOD OF FABRICATING A SEMICONDUCTOR DEVICE USING LASER ANNEALING," which is hereby incorporated by reference in its entirety.

BACKGROUND

As critical dimensions of devices in integrated circuits shrink to the limits of common memory cell technologies, newer techniques are being developed to achieve greater storage capacity. Compared to a planar transistor structure, a vertical structure of the 3D NAND memory devices involves more complex manufacturing processes. As the 3D NAND memory devices migrate to configurations with more memory cell layers to achieve higher densities at a lower cost per bit, it becomes increasingly challenging to improve structures and methods for manufacturing the same, such as forming a high quality channel structure.

SUMMARY

According to aspects of the disclosure, a method for manufacturing a semiconductor device includes forming a channel hole in a stack including alternating first layers and second layers. The stack can be formed over a substrate of the semiconductor device. The method includes forming a gate dielectric layer over an inner surface of the channel hole and forming a channel layer over an inner surface of the gate dielectric layer. The channel layer can have an upper surface that is parallel to the surface of the substrate. The method includes performing laser annealing on the channel layer using laser light. An incidence angle of the laser light on the upper surface of the channel layer causes a total internal reflection to occur at (i) an interface between the channel layer and the gate dielectric layer and (ii) an interface between the channel layer and an insulating layer that is adjacent to the channel layer. The incidence angle is between the laser light and an axis perpendicular to the upper surface of the channel layer.

In an embodiment, the inner surface of the channel layer and the axis perpendicular to the upper surface of the channel layer form a first angle, and the incidence angle of the laser light is determined based on the first angle, a first refractive index of the channel layer, a second refractive index of the gate dielectric layer, and a third refractive index of the insulating layer to cause the total internal reflection. The first refractive index can be larger than the second refractive index and the third refractive index.

In an example, the first angle is zero, and the inner surface of the channel layer has a cylindrical shape, and the incidence angle is less than a threshold angle that is determined based on the first refractive index, the second refractive index, and the third refractive index.

In an example, the first angle is greater than zero, and the inner surface of the channel layer has a tapered cylindrical shape, and the incidence angle is zero. In an example, the first angle is in a range of 0° to 10°.

In an embodiment, a wavelength of the laser light is determined based on an absorption coefficient of the channel layer. In an example, the wavelength is in a range of 520 to 560 nanometers (nm).

In an example, the gate dielectric layer includes a blocking insulating layer of silicon oxide, a charge storage layer of silicon nitride, and a tunneling insulating layer of silicon oxide that are sequentially formed over the inner surface of the channel hole, the channel layer includes polysilicon having a first refractive index, the tunneling insulating layer has a second refractive index, and the insulating layer includes silicon oxide having a third refractive index. The first refractive index can be larger than the second refractive index and the third refractive index.

In an example, the laser annealing is performed with the laser light having a square beam shape.

In an embodiment, the forming the channel layer includes depositing polysilicon over the inner surface of the gate dielectric layer, and the laser annealing is performed such that crystal sizes in a top portion of the channel layer increase 20% to 30%.

In an embodiment, rapid thermal annealing is performed on the semiconductor device.

In an example, monocrystalline Si is formed in a top portion of the channel layer after the laser annealing is performed.

In an example, a distribution of crystal sizes in a top portion of the channel layer is more uniform than a distribution of crystal sizes in a bottom portion of the channel layer after the laser annealing is performed.

According to aspects of the disclosure, a semiconductor device includes a string of transistors disposed along a channel hole. The string of transistors can be vertically stacked over a substrate along a vertical direction perpendicular to a surface of the substrate. The string of transistors can include a gate dielectric layer formed over an inner surface of the channel hole and a channel layer including polysilicon having a first refractive index formed over an inner surface of the gate dielectric layer. The channel layer can have an upper surface that is parallel to the surface of the substrate. The first refractive index can be larger than a second refractive index of the gate dielectric layer. The string of transistors can further include an insulating layer over an inner surface of the channel layer. The first refractive index is larger than a third refractive index of the insulating layer. An average crystal size of polysilicon in a top portion of the channel layer is larger than an average crystal size of polysilicon in a bottom portion of the channel layer.

In an embodiment, the average crystal size of polysilicon in the top portion of the channel layer is at least 20% larger than the average crystal size of polysilicon in the bottom portion of the channel layer.

A conductivity of the top portion of the channel layer is larger than a conductivity of the bottom portion of the channel layer.

The inner surface of the channel layer has a cylindrical shape or a tapered cylindrical shape, and the inner surface of the channel layer and an axis perpendicular to the upper surface of the channel layer form a first angle that is in a range of 0° to 10°.

In an example, the gate dielectric layer includes a blocking insulating layer of silicon oxide, a charge storage layer of silicon nitride, and a tunneling insulating layer of silicon oxide that are sequentially formed over the inner surface of the channel hole, the insulating layer includes silicon oxide, and the second refractive index is of the tunneling insulating layer.

In an example, monocrystalline Si is formed in the top portion of the channel layer.

A distribution of crystal sizes in the top portion of the channel layer is more uniform than a distribution of crystal sizes in the bottom portion of the channel layer.

According to aspects of the disclosure, a memory system includes a controller that is connected to a semiconductor device and the semiconductor device. The semiconductor device can include a string of transistors disposed along a channel hole. The string of transistors can be vertically stacked over a substrate of the semiconductor device along a vertical direction perpendicular to a surface of the substrate. The string of transistors can include a gate dielectric layer formed over an inner surface of the channel hole. The string of transistors can include a channel layer including polysilicon having a first refractive index formed over an inner surface of the gate dielectric layer. The channel layer can have an upper surface that is parallel to the surface of the substrate. The first refractive index can be larger than a second refractive index of the gate dielectric layer. The semiconductor device can include an insulating layer over an inner surface of the channel layer. The first refractive index can be larger than a third refractive index of the insulating layer. An average crystal size of polysilicon in a top portion of the channel layer can be larger than an average crystal size of polysilicon in a bottom portion of the channel layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C show examples of light reflection and light refraction at an interface between two different media according to embodiments of the disclosure.

DETAILED DESCRIPTION

Figure 1D:
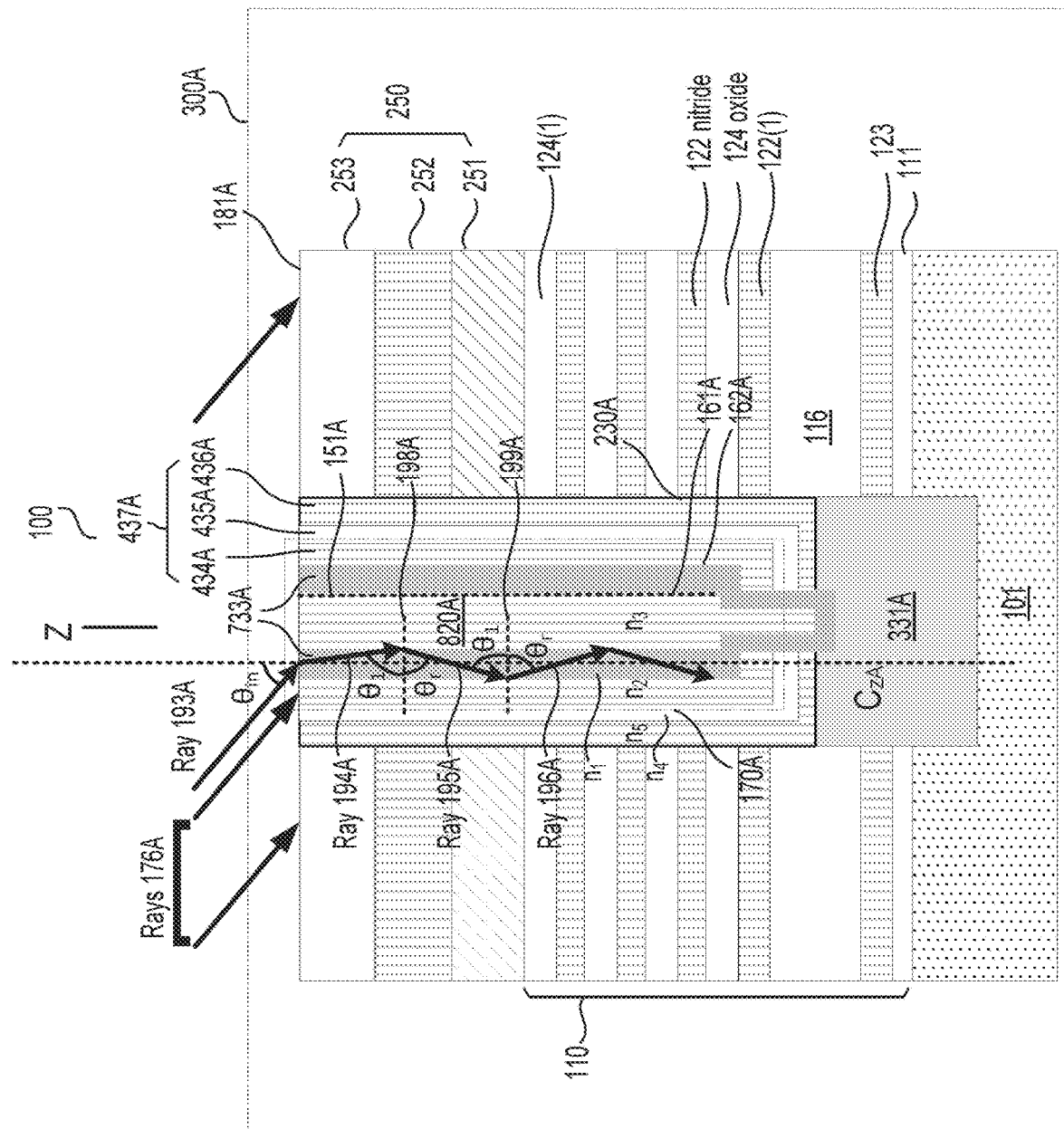
FIG. 1D shows an example of laser annealing of a semiconductor device according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A string of transistors can be formed in a semiconductor device, such as a three-dimensional (3D) NAND memory device, by etching a channel hole in a stack including alternating first and second layers and then forming a channel structure along an inner surface (or a sidewall) of the channel hole. The channel hole and the channel structure can extend along a Z direction perpendicular to a surface (also referred to as a working surface or a working plane) of a substrate of the semiconductor device. The channel structure can include a channel layer and a gate dielectric layer (or a gate dielectric structure). In some examples, the channel layer includes polycrystalline silicon (or polysilicon). Defects such as grain boundaries in polysilicon can decrease a quality (e.g., electron mobility, an electrical conductivity) of the channel layer. Annealing technologies can be applied to anneal polysilicon of the channel layer to increasing grain sizes and reduce defects of the channel layer. However, in some examples, certain annealing technologies are approaching limits of grain size optimization.

Laser annealing can be performed to increase a temperature of the channel layer to a relatively high temperature (e.g., higher than rapid thermal annealing (RTA)). Further, laser annealing can allow for more localized temperature increases. For example, laser annealing can confine a temperature increase predominantly within the channel hole (e.g., the channel structure) without overly disturbing (e.g., melting) other components in the semiconductor device. However, due to light absorption by material(s) (e.g., polysilicon) on or near (e.g., within a penetration depth of light) a surface of the semiconductor device, laser light may not penetrate deep into the channel layer.

The channel layer is disposed between the gate dielectric layer and an insulating layer. The channel structure and the insulating layer are elongated structures predominately along the Z direction. Accordingly, when a first refractive index of the channel layer is higher than refractive indices of the gate dielectric layer and the insulating layer, the channel hole filled with the channel structure and the insulating layer can function in a manner similar to an optical fiber. When laser light is incident on an upper surface (e.g., a first portion of a surface 181A in FIG. 1D) of the channel layer (e.g., a channel layer 733A in FIG. 1D) at a certain angle with respect to the channel layer, the laser light can propagate along the channel layer without exiting the channel layer due to total internal reflection. Further, a wavelength of the laser light can be selected such that absorptions by the gate dielectric layer is reduced or minimized as compared to the absorption by the channel layer.

According to an embodiment of the disclosure, a deep penetration laser annealing method can be performed to anneal the channel layer. The deep penetration laser annealing method can include one or more of (i) annealing the channel layer prior to forming light-absorbing structure(s) (e.g., a polysilicon plug) over the channel layer; (ii) selecting a non-zero angle of the laser light with respect to the channel layer to achieve total internal reflection in the channel layer and also allow light that is incident onto upper surface(s) of respective structure(s) (e.g., the gate dielectric layer) other than the channel layer to reach deeper portions of the channel layer with the non-zero angle; and (iii) selecting a wavelength of the laser light such that the laser light is absorbed predominantly by the channel layer and less absorbed by the structure(s) (e.g., the gate dielectric layer) other than the channel layer.

Accordingly, the deep penetration laser annealing method can result in relatively deep penetration into the channel hole and thus the channel layer. Laser light can be absorbed in a greater portion of the channel layer, such as throughout the channel layer or a significant portion of the channel layer, and thus locally increasing a temperature of a region including the channel structure and in some cases an immediate periphery region of the channel structure with reduced or minimal temperature increase of other components in the semiconductor device.

As described above, the quality (e.g., electron mobility, an electrical conductivity) of the channel layer can be critical to performance of the semiconductor device (e.g., a 3D NAND memory device). A grain boundary is an interface between two grains, or crystallites, in a polycrystalline material, such as polysilicon. Grain boundaries are defects in a crystal structure, and can decrease the electrical and thermal conductivity of the polycrystalline material. A crystallite size (also referred to as a grain size or a crystal size) of polycrystalline silicon in the channel layer can indicate the quality of the channel layer. For example, a smaller grain size of polysilicon increases a number of grain boundaries, and thus increases a number of trap states that trap electrons. Accordingly, more electrons are trapped by the grain boundaries and cannot move freely in the channel layer. As a result, electron mobility and an on-state current can be reduced. A subthreshold swing (SS) and a threshold voltage can also increase.

To increase grain sizes in the channel layer, in some examples, solid phase crystallization (e.g., RTA) can be used. However, in some examples, as a number of transistors in a stack of transistors increases, solid phase crystallization is approaching limits of grain size optimization. Alternatively, liquid phase crystallization can be used to further increase grain sizes with a temperature (e.g., above a melting point of silicon) that is higher than that used in solid phase crystallization.

Laser annealing can be performed to increase a temperature of the channel layer to a relatively high temperature (e.g., higher than the temperature achieved by RTA) and confine a temperature increase predominantly within the channel structure while limiting effects such as heating on other components in the semiconductor device. In some examples, material(s) (e.g., polysilicon) on a surface of the semiconductor device can absorb a significant amount of light, and thus laser light may not penetrate deep into the channel layer to increase a temperature of certain portions (e.g., a bottom portion) of the channel layer. As described above, the deep penetration laser annealing method can be performed.

Light can travel along a straight line in a homogeneous medium (e.g., a medium having a uniformly distributed refractive index). Light can change a propagation direction when light is incident onto an interface between two different media having two different refractive indices, and light reflection (or reflection) and light refraction (or refraction) can occur. Under certain circumstances, light is completely (or totally) reflected at the interface without refraction, and thus experiences a total internal reflection (TIR) at the interface.

FIGS. 1A-1C show examples of light reflection and light refraction at an interface between two different media according to embodiments of the disclosure. In FIG. 1A, light (e.g., an incident ray) traveling in a first medium 190 having a first refractive index $n_1$ is incident onto an interface 183 between the first medium 190 and a second medium 191 having a second refractive index $n_2$. A portion of energy in the incident ray can be reflected back to the first medium 190 as a reflected ray and a remaining portion of energy in the incident ray can propagate into the second medium 191 as a refracted ray.

An incidence angle $\theta_1$ is defined as an angle between a surface norm 184 that is perpendicular to the interface 183 and a propagation direction of the incident ray. A reflection angle $\theta_r$ is defined as an angle between the surface norm 184 and a propagation direction of the reflected ray and is equal to the incidence angle $\theta_1$. A refraction angle $\theta_2$ is defined as an angle between the surface norm 184 and a propagation direction of the refracted ray. Based on the first refractive index $n_1$, the second refractive index $n_2$, and the incidence angle $\theta_1$, the refraction angle $\theta_2$ can be determined using Snell's law as below, $$n_1 \sin \theta_1 = n_2 \sin \theta_2 \qquad \text{(Eq. 1)}$$

As can be seen from Eq. 1, when the second refractive index $n_2$ is less than the first refractive index $n_1$, the refraction angle $\theta_2$ is larger than the incidence angle $\theta_1$. As the incidence angle $\theta_1$ increases, the refraction angle $\theta_2$ reaches 90°, as shown in FIG. 1B. The incidence angle $\theta_1$ at which the refraction angle $\theta_2$ is 90° is referred to as a critical angle $\theta_C$. Based on Eq. 1, the critical angle $\theta_C$ is determined as follows, $\theta_C = \arcsin(n_2/n_1)$ (Eq. 2)

As the incidence angle $\theta_1$ continues to increase beyond the critical angle $\theta_C$, light is totally reflected back to the first medium 190 and energy is confined in the first medium 190 as shown in FIG. 1C.

As shown in FIGS. 1A-1C, when light travels from the first medium 190 having the refractive index $n_1$ onto the second medium 191 having the refractive index $n_2$ and the refractive index $n_1$ is larger than the refractive index $n_2$, TIR can occur when the incidence angle $\theta_1$ is larger the critical angle $\theta_C$. In some examples, the first medium 190 is referred to as a medium that is optically denser than the second medium 191.

TIR can be used in laser annealing of the semiconductor device. According to an embodiment of the disclosure, a channel hole can be formed in a stack including alternating first layers and second layers. The stack can be formed over a substrate of the semiconductor device and the alternating first layers and second layers are stacked along the Z direction that is perpendicular to a surface of the substrate.

A gate dielectric layer can be formed over an inner surface of the channel hole. Subsequently, a channel layer having the first refractive index $n_1$ can be formed over an inner surface of the gate dielectric layer. The channel layer can have an upper surface that is parallel to the surface of the substrate. The first refractive index $n_1$ can be larger than the second refractive index $n_2$ of the gate dielectric layer and a third refractive index $n_3$ of an insulating layer that is adjacent to the channel layer. The deep penetration laser annealing method can be performed on the channel layer using laser light where an incidence angle of the laser light incident on the upper surface of the channel layer causes TIR to occur at an interface between the channel layer and the gate dielectric layer and at an interface between the channel layer and the insulating layer. Additional steps can be used to form gate structures for a string of transistors.

In some embodiments, the deep penetration laser annealing method can be performed on the channel layer using laser light where an incidence angle of the laser light incident on the upper surface of the channel layer causes TIR to occur at (i) an interface between the channel layer and the gate dielectric layer or at (ii) an interface between the channel layer and the insulating layer.

FIG. 1D shows laser annealing (e.g., the deep penetration laser annealing method) of a semiconductor device 100 according to an embodiment of the disclosure. The semiconductor device 100 can be a nonvolatile memory device, such as a 3D NAND flash memory device where transistors (e.g., memory cells) can be stacked along the Z direction into multiple strings of transistors to increase a storage density. Referring to FIG. 1D, a region 300A of the semiconductor device 100 can include a gate dielectric layer 437A and a channel layer 733A that are sequentially formed in a channel hole 230A. The gate dielectric layer 437A can be disposed between the channel layer 733A and gate structures that will be formed subsequently. The gate dielectric structure 437A can extend in the Z direction.

The channel hole 230A, the gate dielectric structure 437A, the channel layer 733A, and the insulating layer 820A can have any suitable shape, dimension, and materials. In an example shown in FIG. 1D, the channel hole 230A, an inner surface 162A of the gate dielectric structure 437A, an inner surface 161A of the channel layer 733A, and the insulating layer 820A have a cylindrical shape. The gate dielectric structure 437A can include multiple dielectric layers, such as a tunnel insulating layer 434A, a charge storage layer 435A, and a blocking insulating layer 436A that are sequentially stacked over the channel layer 733A. Referring to FIG. 1D, an inner surface of the tunnel insulating layer 434A is the inner surface 162A of the gate dielectric layer 437A and is cylindrical.

The channel layer 733A has the first refractive index $n_1$, the tunnel insulating layer 434A has the second refractive index $n_2$, the charge storage layer 435A has a refractive index $n_4$, the blocking insulating layer 436A has a refractive index $n_5$, and the insulating layer 820A has a refractive index $n_3$. Whether light propagating in the channel layer 733A experiences TIR can depend on the first refractive index $n_1$ of the channel layer 733A and refractive indices (e.g., $n_2$ and $n_3$) of two layers (e.g., the tunnel insulating layer 434A and the insulating layer 820A) that are adjacent to the channel layer 733A. When the first refractive index $n_1$ of the channel layer 733A is larger than the refractive indices $n_2$ and $n_3$ of the tunnel insulating layer 434A and the insulating layer 820A, respectively, a structure 170A (also referred to as a fiber-like structure 170A) including the channel layer 733A, the tunnel insulating layer 434A, and the insulating layer 820A behaves in a manner similar to a fiber. The channel layer 733A can act like a core of the fiber-like structure 170A, and the tunnel insulating layer 434A and the insulating layer 820A can act as cladding layers of the fiber-like structure 170A. The structure 170A is inside the channel hole 230A.

For the structure 170A, the inner surface 161A of the channel layer 733A has a cylindrical shape. In a cross-sectional view, such as FIG. 1D, that is perpendicular to a surface of a substrate 101, a top portion of the inner surface 161A is a straight line 151A parallel to the Z direction, and thus the fiber axis $C_{zA}$ of the channel layer 733A (or the structure 170A) that is parallel to the straight line 151A is also parallel to the Z direction. The straight line 151A can be referred to as a line of interception of the inner surface 161A of the channel layer 733A and a plane that is perpendicular to the surface of the substrate 101. The straight line 151A forms a first angle with an axis perpendicular to the upper surface 181A of the channel layer 733A. The inner surface of the channel layer 733A and the axis perpendicular to the upper surface 181A of the channel layer 733A form the first angle. The axis is also the Z direction.

In an embodiment, a second angle (also an incidence angle) that is between the laser light incident onto the upper surface and the axis (also referred to as a surface norm) can be determined based on the first angle, the first refractive index $n_1$, the second refractive index $n_2$, and the third refractive index $n_3$ so that the laser light incident onto the upper surface of the channel layer 733A experiences the total internal reflection.

Referring to FIG. 1D, a ray 193A is incident onto the upper surface (e.g., the first portion of the upper surface 181A) of the channel layer 733A with the incidence angle $\theta_{in}$ (or the second angle) between the ray 193A and a surface norm (e.g., Z direction in FIG. 1D) of the upper surface 181A. The surface norm is parallel to the fiber axis $C_{zA}$ of the structure 170A.

A portion of the ray 193A enters the channel layer 733A as a refracted ray (or a ray 194A). The ray 194A is incident onto an interface (also the inner surface 161 of the channel layer 733A) between the channel layer 733A and the insulating layer 820A at an incidence angle $\theta_1$. The incidence angle $\theta_1$ is between the ray 194A and a surface norm 198A of the interface. Subsequently, the ray 194A is reflected back to the channel layer 733A as a ray 195A. The ray 195A is incident onto an interface (also the inner surface 162 of the tunnel insulating layer 434A) between the channel layer 733A and the tunnel insulating layer 434A at the incidence angle $\theta_1$. Subsequently, the ray 195A is reflected back to the channel layer 733A as a ray 196A. The above process can repeat within the channel layer 733A until light is absorbed in the channel layer 733A or exit from the channel layer 733A.

In an example as shown in FIG. 1D, the incidence angle $\theta_{in}$ (also referred to as a second angle) is less than an acceptance angle (also referred to as a threshold angle) $\theta_a$, and the rays 194A-196A experience TIR in the channel layer 733A. Thus, the rays 194A and 196A do not enter into the insulating layer 820A at the interface (also the inner surface 161A of the channel layer 733A) between the channel layer 733A and the insulating layer 820A. The ray 195A does not enter the gate dielectric layer 437A (e.g., the tunneling layer 434A) at the interface (also the inner surface 162A of the tunnel insulating layer 434A) between the channel layer 733A and the tunnel insulating layer 434A. The acceptance angle $\theta_a$ is an angle between the ray 193A and the fiber axis $C_{zA}$ (e.g., Z direction in FIG. 1D) of the structure 170A at which the incidence angle $\theta_1$ for the rays 194A-196A becomes a critical angle $\theta_C$. Thus, the acceptance angle $\theta_a$ can be dependent on the refractive indices $n_1$, $n_2$, and $n_3$. The acceptance angle $\theta_a$ is a measure of light gathering ability of the fiber-like structure 170A, and can be measured as a half-angle of an acceptance cone (e.g., a maximum cone of light that can enter or exit the fiber-like structure 170A.)

Figure 1E:
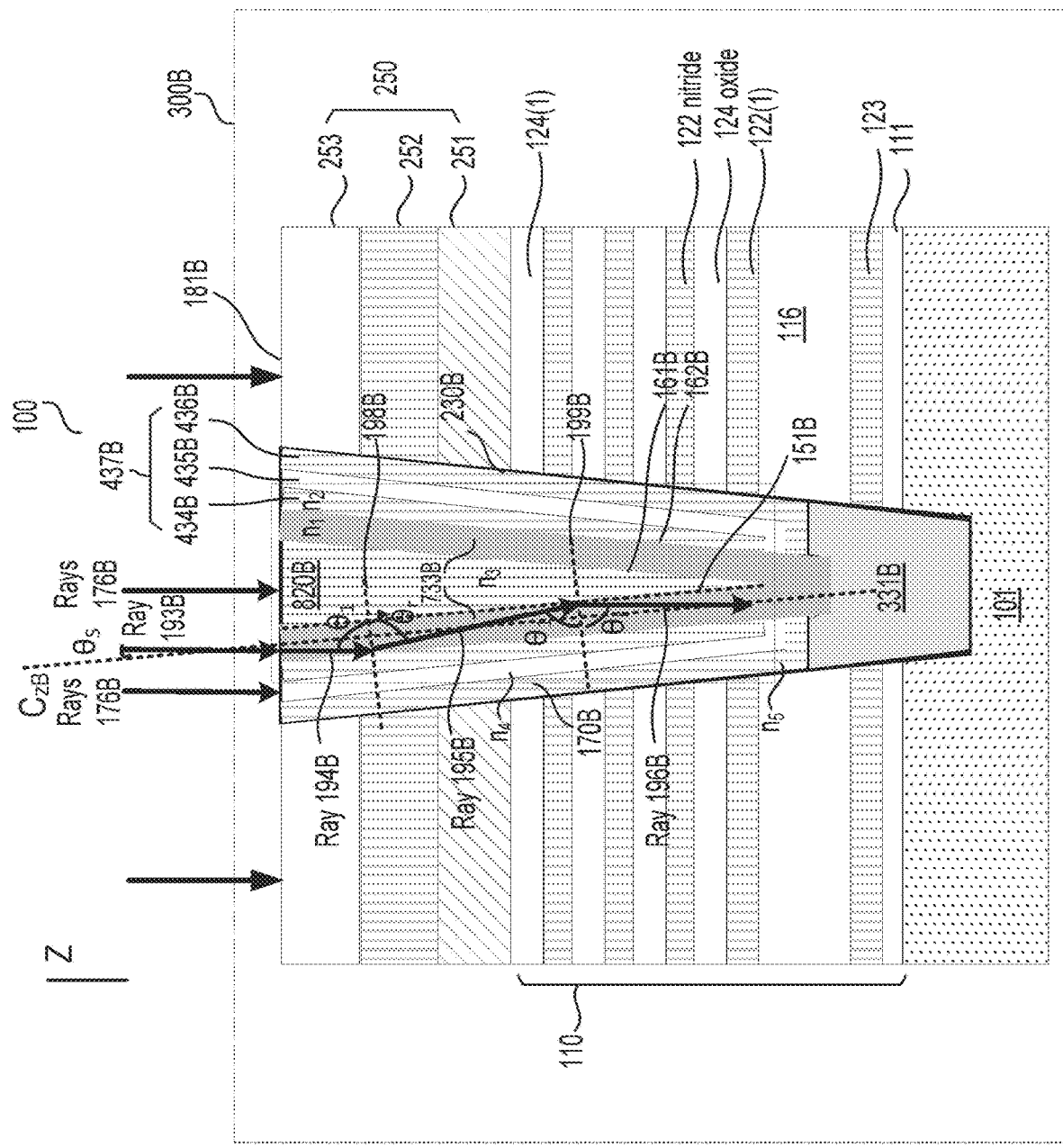
FIG. 1E shows an example of laser annealing of a semiconductor device according to an embodiment of the disclosure.

In general, a fiber axis (e.g., the fiber axis $C_{zA}$) of a fiber-like structure (e.g., the fiber-like structure 170A) can form any suitable angle with the Z direction. In FIG. 1D, the fiber axis $C_{zA}$ of the fiber-like structure 170A is parallel to the Z direction. In FIG. 1E, a fiber axis $C_{zB}$ of a fiber-like structure 170B is at an angle $\theta_S$ with respect to the Z direction The above descriptions for FIG. 1D can be suitably adapted to FIG. 1E.

Referring to FIG. 1E, the semiconductor 100 includes a region 300B. The region 300B can include a gate dielectric layer 437B and a channel layer 733B that are sequentially formed in a channel hole 230B. The gate dielectric layer 437B, the channel layer 733B, and channel hole 230B can be identical to the gate dielectric layer 437A, the channel layer 733A, and the channel hole 230A, respectively, except that a shape of an inner surface 162B of the gate dielectric layer 437B, an inner surface 161B of the channel layer 733B, and the channel hole 230B are a tapered cylindrical shape. As shown in FIG. 1E, in a cross-sectional view that is perpendicular to the surface of the substrate 101, a top portion of the inner surface 161B is a straight line 151B that forms the angle $\theta_S$ with respect to the Z direction and $\theta_S$ is not zero. Thus, the fiber axis $C_{zB}$ of the channel layer 733B (or the fiber-like structure 170B) that is parallel to the straight line 151B forms the angle $\theta_S$ with respect to the Z direction. The straight line 151B is referred to as a line of interception of the inner surface 161B of the channel layer 733B and the plane that is perpendicular to the surface of the substrate 101. The straight line 151B forms a first angle with the Z direction where the first angle is $\theta_S$.

As described above, the gate dielectric layer 437B can be disposed between the channel layer 733B and gate structures that will be formed subsequently. The gate dielectric structure 437B can include multiple dielectric layers, such as a tunnel insulating layer 434B, a charge storage layer 435B, and a blocking insulating layer 436B that are sequentially stacked over the channel layer 733B.

The channel layer 733B has the first refractive index $n_1$, the tunnel insulating layer 434B has the second refractive index $n_2$, the charge storage layer 435B has the refractive index $n_4$, the blocking insulating layer 436B has the refractive index $n_5$, and the insulating layer 820B has the refractive index $n_3$. When the first refractive index $n_1$ of the channel layer 733B is larger than the refractive indices $n_2$ and $n_2$ of the tunnel insulating layer 434B and the insulating layer 820B, respectively, the structure 170B including the channel layer 733B, the tunnel insulating layer 434B, and the insulating layer 820B can behave in a manner similar to a fiber. The channel layer 733B can act like a core of the fiber-like structure 170B. The tunnel insulating layer 434B and the insulating layer 820B can act as cladding layers of the fiber-like structure 170B.

In an embodiment, a second angle that is between the laser light incident onto the upper surface and an axis (or a surface norm) perpendicular to the upper surface 181B of the channel layer 733B (e.g., the Z direction in FIG. 1E) can be determined based on the first angle (e.g., $\theta_S$), the first refractive index $n_1$, the second refractive index $n_2$, and the third refractive index $n_3$ so that the laser light incident onto the upper surface of the channel layer 733B experiences the total internal reflection.

Referring to FIG. 1E, a ray 193B is incident onto the upper surface (e.g., a first portion of the upper surface 181B) of the channel layer 733B perpendicularly along the Z direction, and thus the incidence angle $\theta_{in}$ (or the a second angle) between the ray 193B and the surface norm (e.g., Z direction in FIG. 1E) of the upper surface 181B is 0°. The surface norm is at the angle $\theta_S$ with respect to the fiber axis $C_{zB}$ of the fiber-like structure 170B.

A portion of the ray 193B enters the channel layer 733B as a refracted ray (or a ray 194B). The ray 194B is incident onto an interface (also the inner surface 162B of the tunnel insulating layer 434B) between the channel layer 733B and the tunnel insulating layer 434B at an incidence angle $\theta_1$. The incidence angle $\theta_1$ is between the ray 194B and a surface norm 198B of the interface 162B. Subsequently, the ray 194B is reflected back to the channel layer 733B as a ray 195B. The ray 195B is incident onto an interface (also the inner surface 161B of the channel layer 733B) between the channel layer 733B and the insulating layer 820B at the incidence angle $\theta_1$. Subsequently, the ray 195B is reflected back to the channel layer 733B as a ray 196B. The above process can repeat within the channel layer 733B until light is absorbed in the channel layer 733B or exit from the channel layer 733B.

In an example as shown in FIG. 1E, the angle $\theta_S$ is such that the incidence angle $\theta_1$ is larger than the critical angle $\theta_{C1}$ at the interface 162B and the critical angle $\theta_{C2}$ at the interface 161B, the rays 194B-196B experience TIR in the channel layer 733B. Thus, the rays 195B do not enter into the insulating layer 820B at the interface (also the inner surface 161B of the channel layer 733B) between the channel layer 733B and the insulating layer 820B. The rays 194B also do not enter the gate dielectric layer 437B (e.g., the tunneling layer 434B) at the interface (also the inner surface 162B of the tunnel insulating layer 434B) between the channel layer 733B and the tunnel insulating layer 434B. From FIG. 1E, $\theta_S=90°-\theta_1$, and thus when $\theta_S$ is less than $(90°-\theta_{C1})$ and $(90°-\theta_{C2})$, the rays 194B-196B experience TIR in the channel layer 733B. The critical angle $\theta_{C1}$ at the interface 162B can be determined using Eq. 2 as $\theta_{C1}=\arcsin(n_2/n_1)$ and the critical angle $\theta_{C2}$ at the interface 161B can be determined using Eq. 2 as $\theta_{C2}=\arcsin(n_3/n_1)$. In an example, the refractive indices $n_2$ and $n_3$ are identical, then $\theta_C$ is equal to $\theta_{C1}$ and $\theta_{C2}$. When $\theta_S$ is less than $(90°-\theta_C)$, the rays 194B-196B experience TIR in the channel layer 733B.

Referring to FIGS. 1D-1E, the deep penetration laser annealing method includes performing the laser annealing prior to forming light absorption structures over the channel layer. In examples shown in FIGS. 1D-1E, laser light is incident onto the upper surface of the channel layer (e.g., 733A or 733B) directly. Alternatively, other layer(s) that are transparent to the laser light can be formed over the channel layer.

Referring again to FIGS. 1D-1E, laser light (e.g., rays 176A or 176B) that is incident onto other regions (e.g., 437A, 437B, 820B, or the mask 250) that are different from the channel layer (e.g., 733A or 733B) can propagate through the other regions initially, and then enter the channel layer. After the laser light enters the channel layer, the laser light can (i) propagate in the channel layer, (ii) can be absorbed by the channel layer, or (iii) exit into the insulating layer (e.g., 820A or 820B) or the gate dielectric layer (e.g., 437A or 437B). In some example, a portion of the laser light (e.g., rays 176A or 176B) that is incident onto other regions enters deeper portions of the channel layer. For example, the rays 176B can propagate a relatively long distance in the insulating layer 820B before being incident on the interface between the insulating layer 820B and the channel layer 733B. Because of reduced or minimal absorption by the other regions, the laser light (e.g., rays 176A or 176B) can reach deeper portions of the channel layer. Because of reduced or minimal absorption by the other regions, in some examples, the laser light or laser energy is concentrated in the channel layer.

According to an embodiment of the disclosure, a wavelength or a wavelength range used for the laser light can be determined based on an absorption requirement and a penetration requirement of the channel layer (e.g., polysilicon). Larger absorption by the channel layer can lead to effectively heating (and thus annealing) of the channel layer while smaller absorption by the channel layer can lead to deeper penetration. Thus, based on an absorption coefficient of the channel layer (e.g., polysilicon), laser light having a wavelength in green color (e.g., 520-560 nm) can be determined to satisfy both the absorption and penetration requirements.

In an embodiment, the channel layer includes polysilicon. According to an embodiment of the disclosure, after annealing by the deep penetration laser annealing method, an average crystal size of polysilicon in the channel layer (e.g., 733A or 733B) can be larger than an average crystal size of a channel layer that is annealed by related technologies (e.g., RTA). For example, an average crystal size of polysilicon in a top portion of the channel layer (e.g., 733A or 733B) can increase by at least 20%, such as 20% to 30% compared to an average crystal size of a channel layer that is annealed by related technologies (e.g., RTA).

In an example, a conductivity in the channel layer (e.g., 733A or 733B) can be larger than a conductivity of a channel layer that is annealed by related technologies (e.g., RTA).

In an embodiment, after annealing by the deep penetration laser annealing method, an average crystal size of polysilicon in a top portion of the channel layer (e.g., 733A or 733B) can be larger (e.g., at least 20% larger) than an average crystal size of polysilicon in a bottom portion of the channel layer (e.g., 733A or 733B). Because of the increase of the average crystal size of polysilicon in the top portion of the channel layer (e.g., 733A or 733B), a conductivity of the top portion of the channel layer (e.g., 733A or 733B) can be larger than a conductivity of the bottom portion of the channel layer (e.g., 733A or 733B).

In an example, monocrystalline Si can be formed in the top portion of the channel layer (e.g., 733A or 733B).

In an example, a distribution of crystal sizes in the top portion of the channel layer (e.g., 733A or 733B) is more uniform than a distribution of crystal sizes in the bottom portion of the channel layer.

Referring to FIGS. 1D-1E, the region 300A or 300B is formed in a stack 110 over the substrate 101 of the semiconductor device 100. The stack 110 includes alternating first layers 122 and second layers (also referred to as the insulating layers 124). The stack 110 can further include one or more additional layers, such as the insulating layers 111 and 116 and a layer 123, between the substrate 101 and the lowermost first layer 122(1). A mask layer or a sacrificial layer 250 can be formed and patterned over a topmost layer, such as the topmost second layer 124(1), of the stack 110 to protect the semiconductor device 100 during subsequent processing. The mask layer 250 can include one or more hard mask sublayers 251-253, such as silicon nitride and silicon oxide.

Figure 9A:
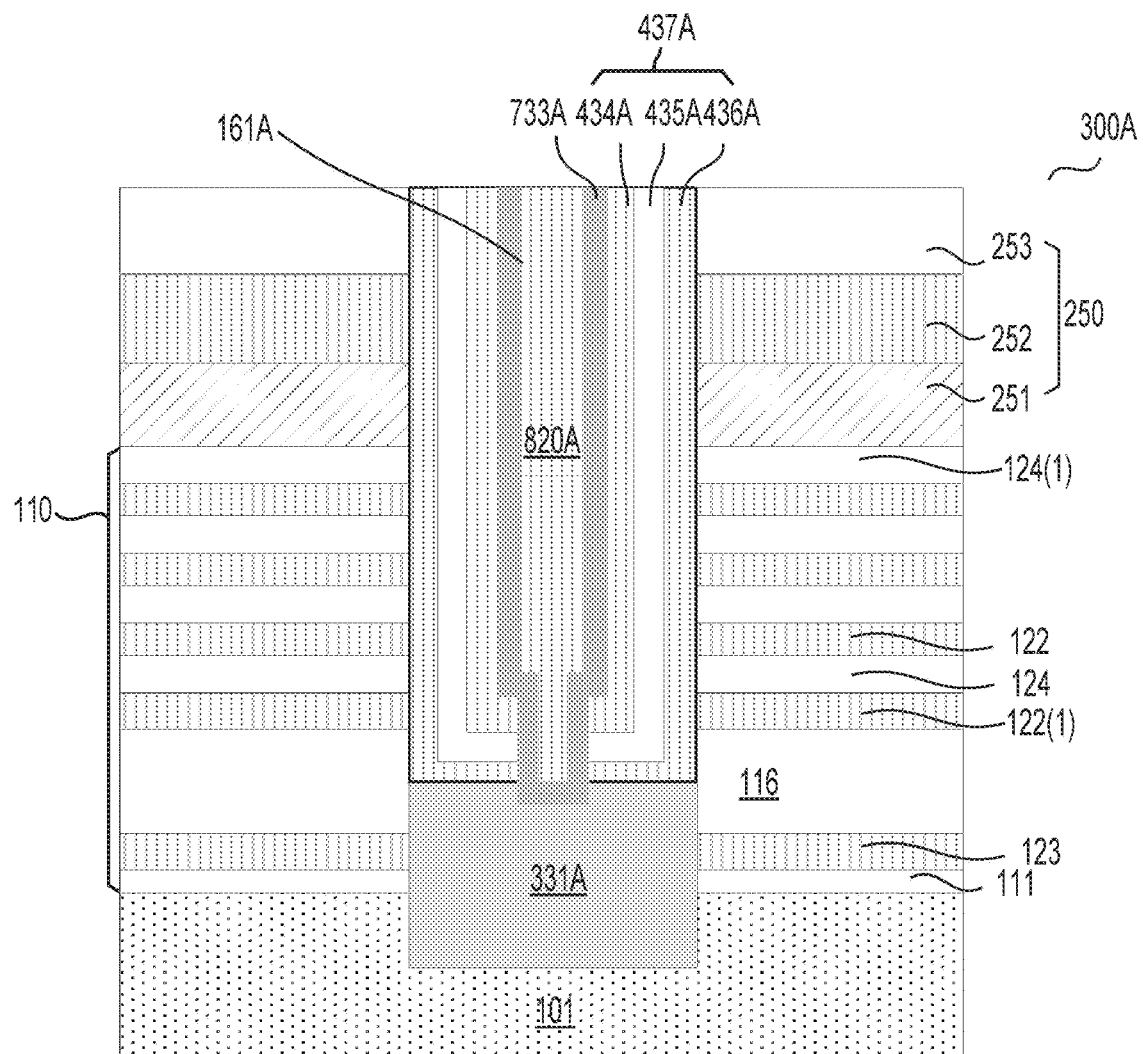
Figure 9B:
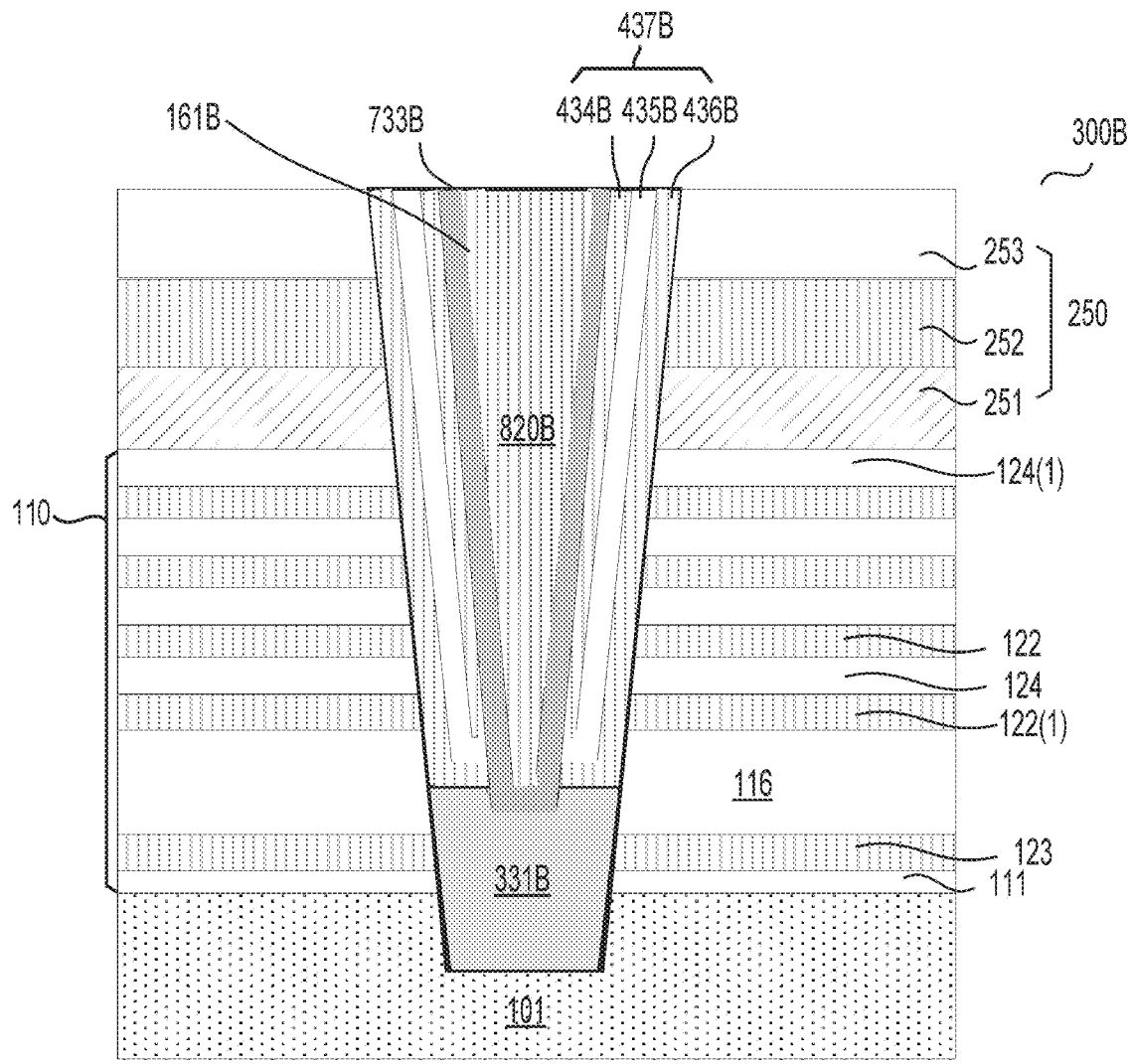
Figure 10:
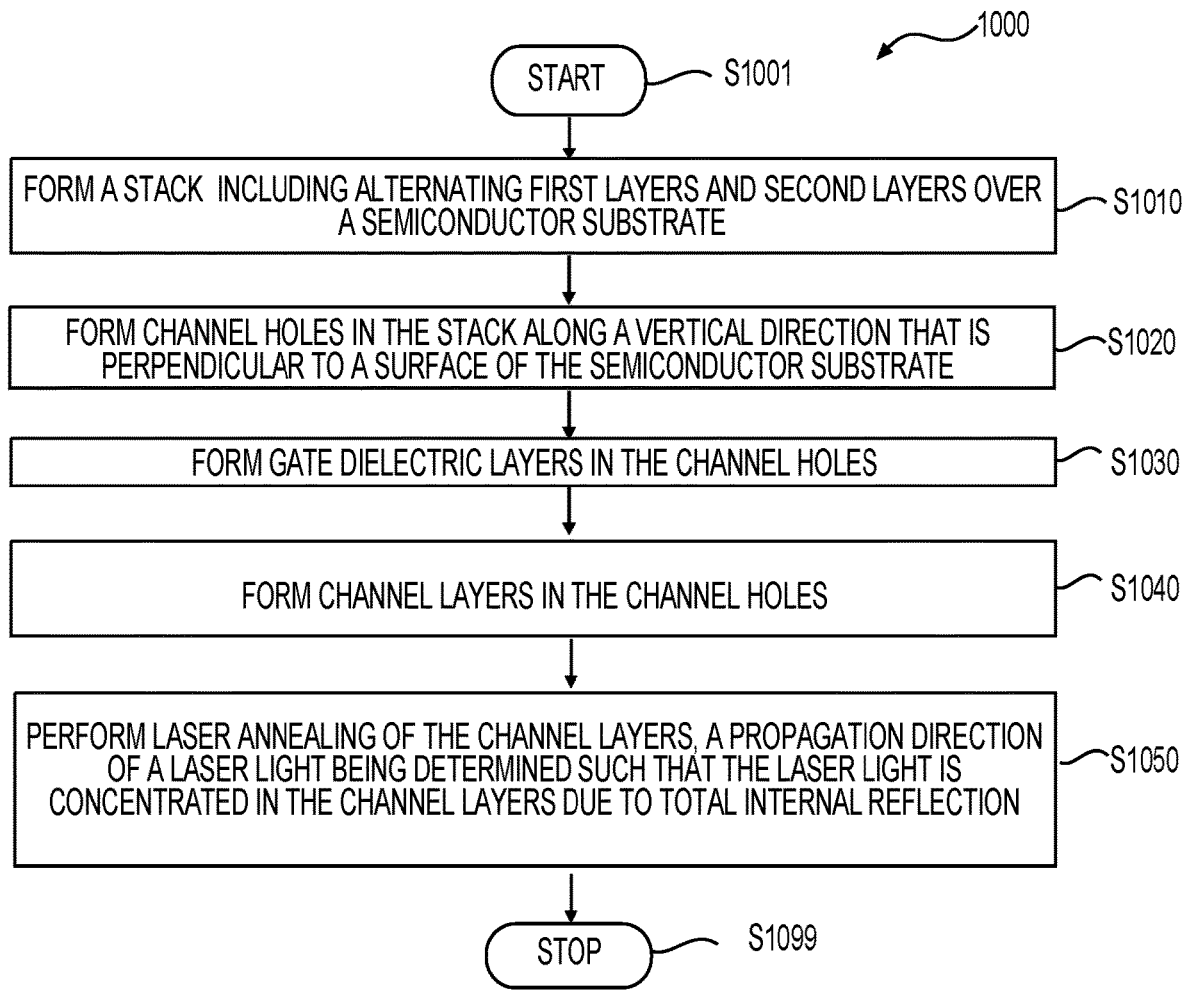
FIG. 10 shows a flow chart outlining an exemplary process for manufacturing a semiconductor device according to an embodiment of the disclosure.

FIGS. 2, 3A-3B, 4A-4B, 5A-5B, 6A-6B, 7A-7B, 8A-8B, and 9A-9B show a cross-sectional view of a portion of the semiconductor device 100 at various steps of an exemplary process in accordance with an exemplary embodiment of the disclosure. FIG. 10 shows a flow chart outlining an exemplary process 1000 for semiconductor fabrication to fabricate the semiconductor device 100 according to an embodiment of the disclosure. The semiconductor device 100 can be a nonvolatile memory device, such as a 3D NAND flash memory device where the transistors can be memory cells and can be stacked along the Z direction to increase a storage density. As used herein, the semiconductor device 100 can include transistors (e.g., field-effect transistors and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, and the like.

Figure 2:
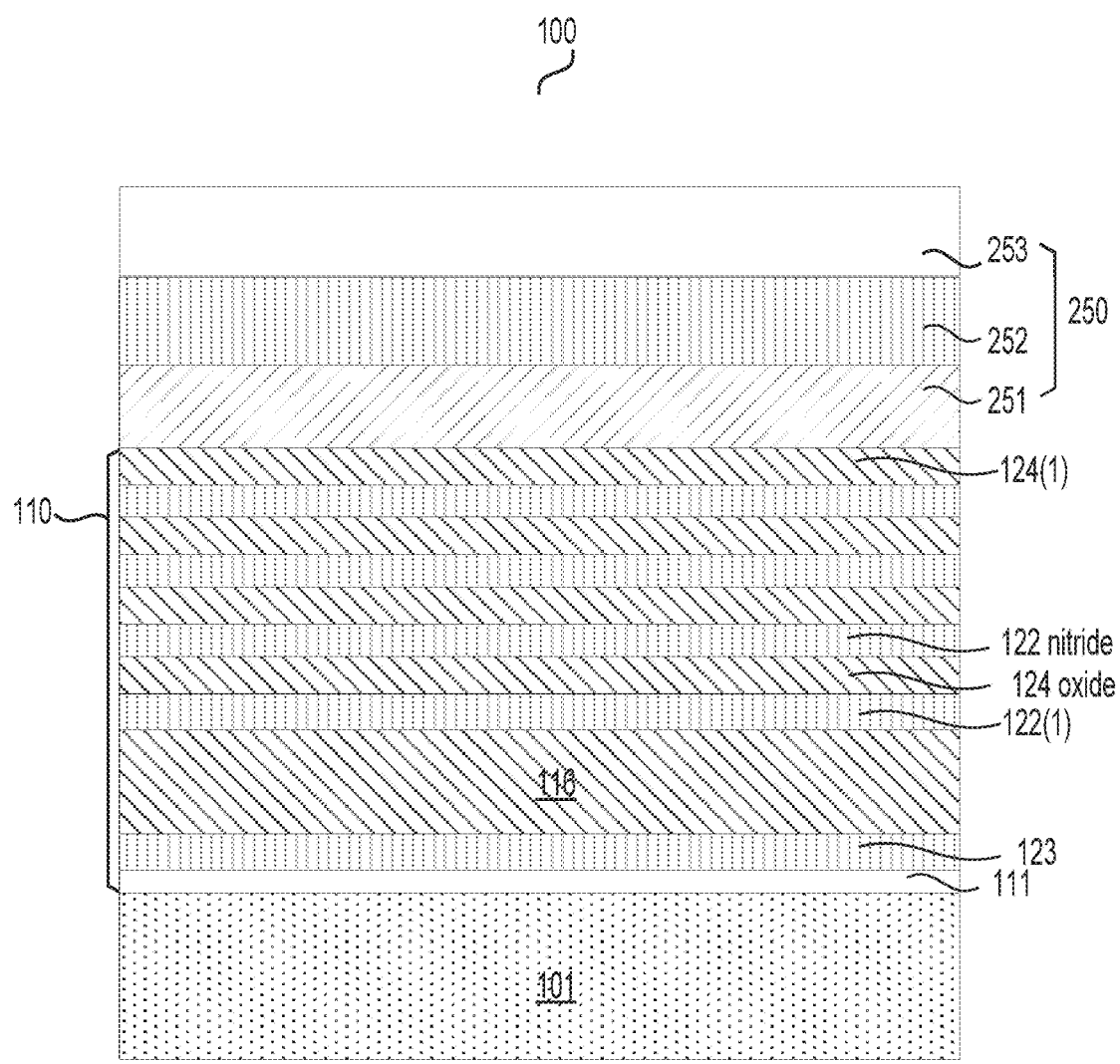
FIGS. 2, 3A-3B, 4A-4B, 5A-5B, 6A-6B, 7A-7B, 8A-8B, and 9A-9B show cross-sectional views of a portion of a semiconductor device at various steps of an exemplary process in accordance with an exemplary embodiment of the disclosure.

The process 1000 starts at step S1001 and proceeds to step S1010. Referring to FIGS. 2 and 10, at step S1010, the stack 110 can be formed over the substrate 101 of the semiconductor device 100. The stack 110 can include the alternating first layers 122 and the second layers 124. Multiple strings of transistors can be formed in the stack 110. The substrate 101 can be any suitable substrate and can be processed with various suitable features. The substrate 101 can be formed of any suitable semiconductor material, such as silicon (Si), germanium (Ge), SiGe, a compound semiconductor, an alloy semiconductor, and the like. Additionally, the substrate 101 can include various layers, including conductive or insulating layers formed on a semiconductor substrate. The substrate 101 can be a silicon-on-insulator (SOI) substrate. Further, the substrate 101 can include an epitaxial layer formed on insulator. The substrate 101 can include various doping configurations depending on design requirements.

The stack 110 can be manufactured using a variety of semiconductor processing techniques, such as photolithography, chemical vapor deposition (CVD) including furnace CVD, low pressure CVD, and the like, physical vapor deposition (PVD), atomic layer deposition (ALD), dry etching, wet etching, chemical mechanical planarization (CMP), ion implantation, and the like.

The insulating layer 111 and 116 and the layer 123 can include any suitable insulating materials with any suitable thicknesses. In some examples, the insulating layer 111 includes $SiO_2$. In an example, a thickness of the insulating layer 111 is about 18 nm. The layer 123 can include silicon nitride having a thickness of 10 to 100 nm, and the insulating layer 116 can include $SiO_2$ having a thickness of 130-180 nm.

The first layers 122 and the second layers 124 are alternately formed over the insulating layer 116 and can include, for example, any suitable dielectric materials that have different etch rates. For example, the first layers 122 can be formed with silicon nitride, the second layers 124 can be formed by using a dielectric material, such as $SiO_2$, that has a different etch rate from that of the first layers 122. In various examples, the layer 123 and the first layers 122 are removed and replaced with the respective gate structures in subsequent steps.

Thicknesses of the first layers 122 can be different from or identical to each other. In an example, the thicknesses of the first layers 122 range from 20 to 50 nm, for example, the thickness of the first layers 122 can be about 35 nm. Any suitable deposition process, such as CVD, PVD, ALD, or any combination thereof, can be applied to form the first layers 122.

The second layers 124 can have any suitable thicknesses, such as between 20 and 40 nm, and can be formed by performing CVD, PVD, ALD, or any combination thereof. In an example, the thickness of the second layers 124 is 25 nm.

In an example, a thickness of the stack 110 can be about 1-20 microns, such as 8-10 microns. Any suitable number of transistors or memory cells in a stack of transistors can be formed in the stack 110, such as 32, 64, 96, 128, and the like. Accordingly, numbers of the first layers 122 and the second layers 124 may vary according to the number of the memory cells in the stack 110.

Referring to FIG. 2, the mask layer 250 can include one or more hard mask sublayers 251-253, such as silicon nitride and silicon oxide. In various embodiments, the mask layer 250 can be patterned according to any suitable techniques, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Figure 3A:
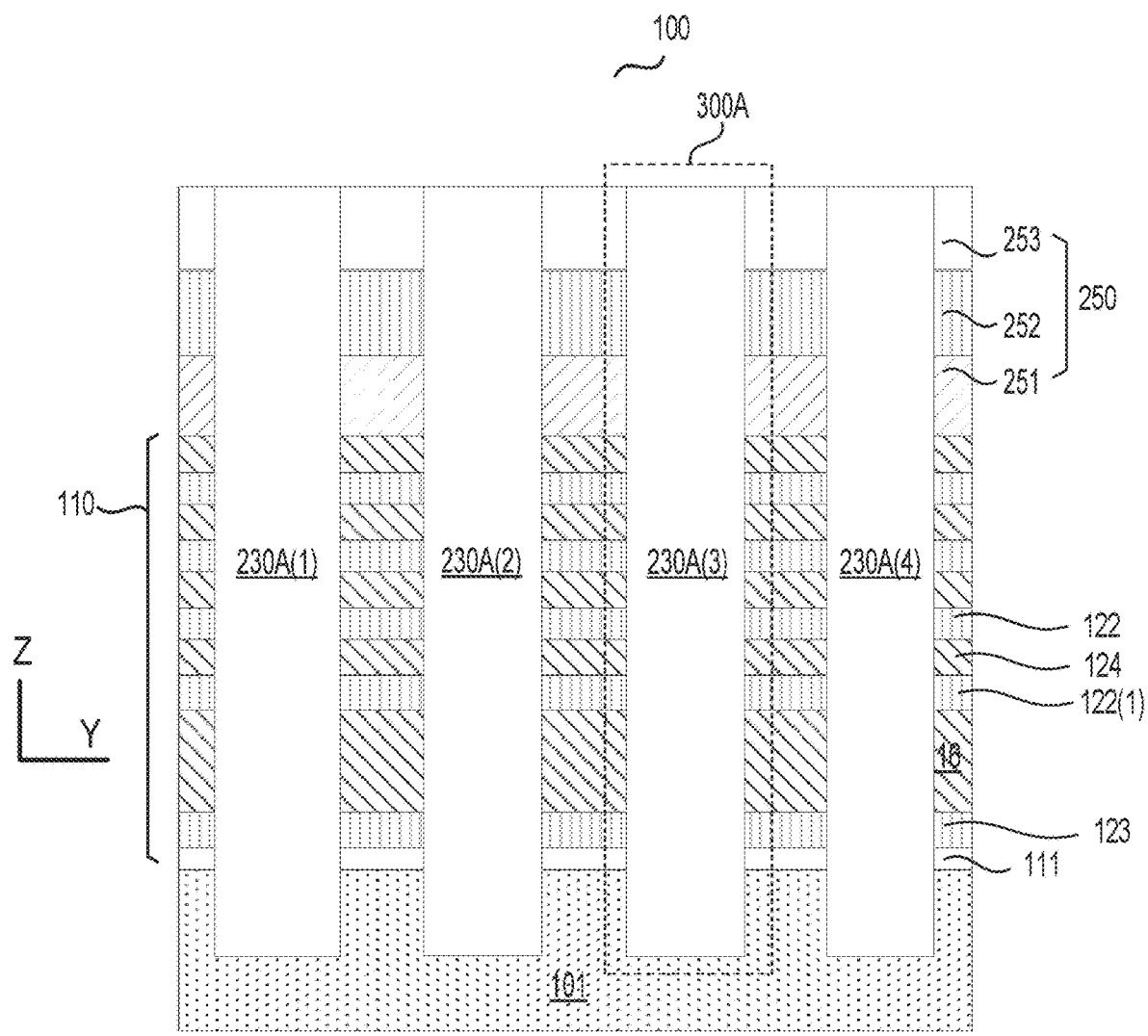
Figure 3B:
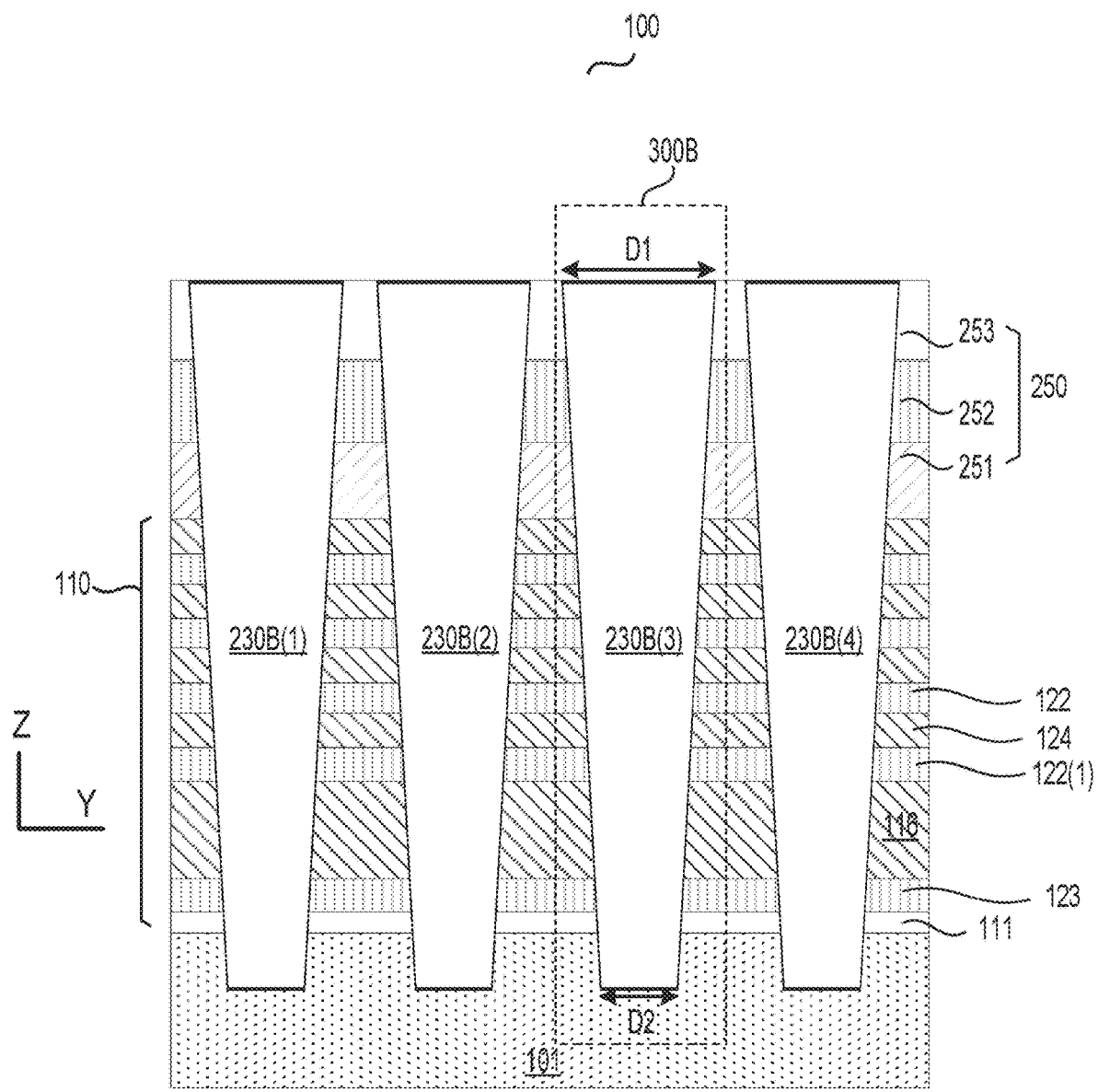

Referring to FIGS. 3A, 3B, and 10, at step S1020 of the process 1000, multiple channel holes (e.g., 230A(1)-(4) in FIG. 3A or 230B(1)-(4) in FIG. 3B) extending into the substrate 101 can be formed according to the patterned mask layer 250 using any suitable process. The multiple channel holes (e.g., 230A(1)-(4) in FIG. 3A or 230B(1)-(4) in FIG. 3B) are formed along the Z direction that is perpendicular to the surface of the substrate 101. In an example, an upper portion of the substrate 101, portions of the insulating layers 111 and 116, the layer 123, the first layers 122, and the second layers 124 that are exposed by the patterned mask layer 250, are removed to form the channel holes (e.g., 230A(1)-(4) in FIG. 3A or 230B(1)-(4) in FIG. 3B). The channel holes (e.g., 230A(1)-(4) in FIG. 3A or 230B(1)-(4) in FIG. 3B) are formed using an etching process, such as a dry etching. In an example, the dry etching is a plasma etch referred to as a plasma punch.

The channel holes (e.g., 230A(1)-(4) in FIG. 3A or 230B(1)-(4) in FIG. 3B) can have any suitable shapes and sizes. In an example shown in FIG. 3A, the channel holes 230A(1)-(4) have a cylindrical shape. In an example shown in FIG. 3B, the channel holes 230B(1)-(4) have a tapered cylindrical shape where a top width D1 is larger than a bottom width D2 in the Z-Y plane. The tapered profile can be obtained by tapering a mask profile of the patterned mask layer 250, adjusting parameters of the etching process, and the like. A tapered profile can help subsequent deposition steps and improve a sidewall coverage. In an example, the top width D1 can range from 90 to 160 nm, such as 120 nm, and the bottom width D2 can range from 50 to 110 nm, such as 95 nm.

In some examples, a subsequent plasma ashing and a wet clean can be applied to remove the remaining mask layer 250. Alternatively, the mask layer 250 remains over the stack 110 as shown in FIGS. 4A-4B, 5A-5B, 6A-6B, 7A-7B, 8A-8B, and 9A-9B.

During subsequent manufacturing steps, multiple strings of transistors (or multiple stacks of transistors) are formed in the channel holes (e.g., 230A(1)-(4) in FIG. 3A or 230B(1)-(4) in FIG. 3B), respectively. For purposes of clarity, subsequent description with reference to FIGS. 1D, 4A, 5A, 6A, 7A, 8A, and 9A is made based on the channel hole 230A(3) (also referred to as 230A) in the region 300A in FIG. 3A. Subsequent description with reference to FIGS. 1E, 4B, 5B, 6B, 7B, 8B, and 9B is made based on the channel hole 230B(3) (also referred to as 230B) in the region 300B in FIG. 3B. The description can be suitably adapted to the other channel holes (e.g., 230A(1), 230A(2), and 230A(4) or 230B(1), 230B(2), and 230B(4)) in the semiconductor device 100.

Figure 4A:
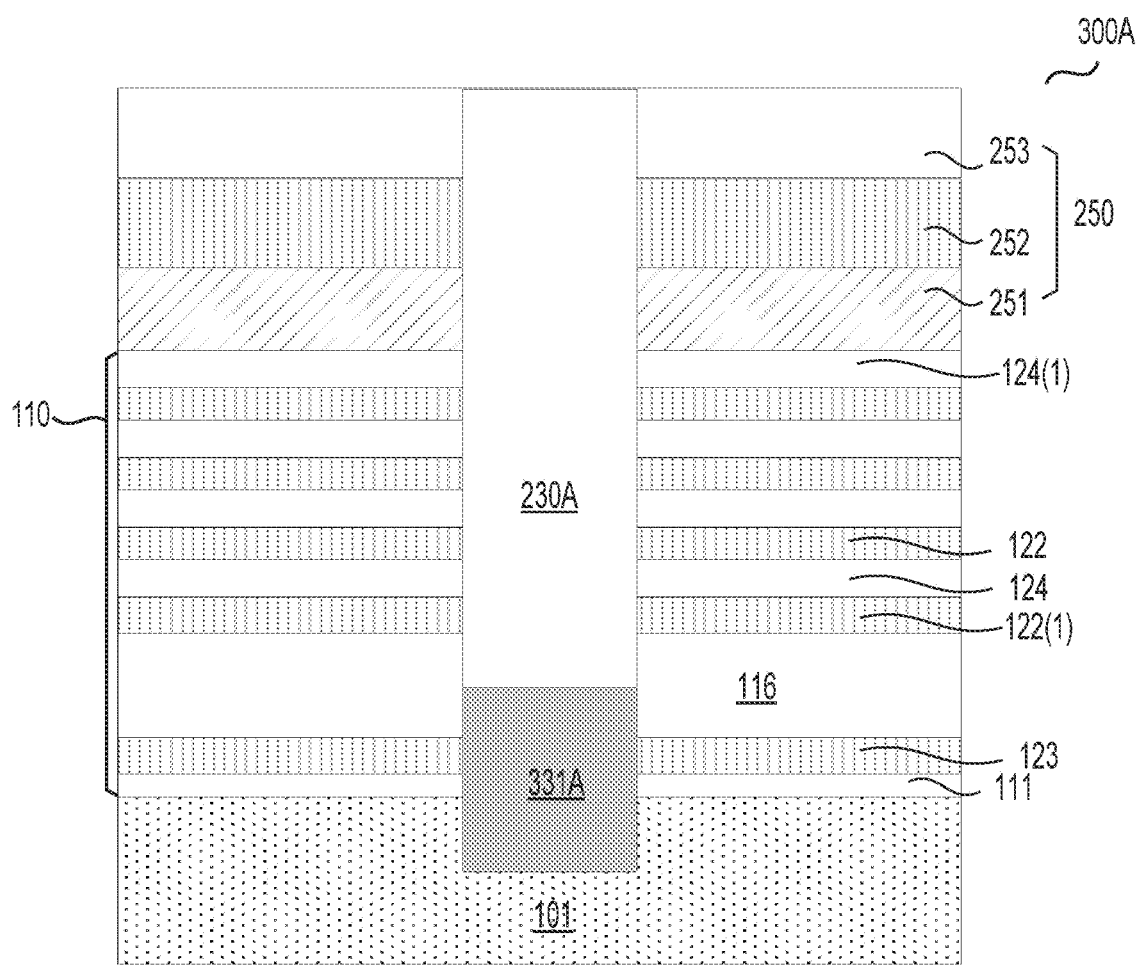
Figure 4B:
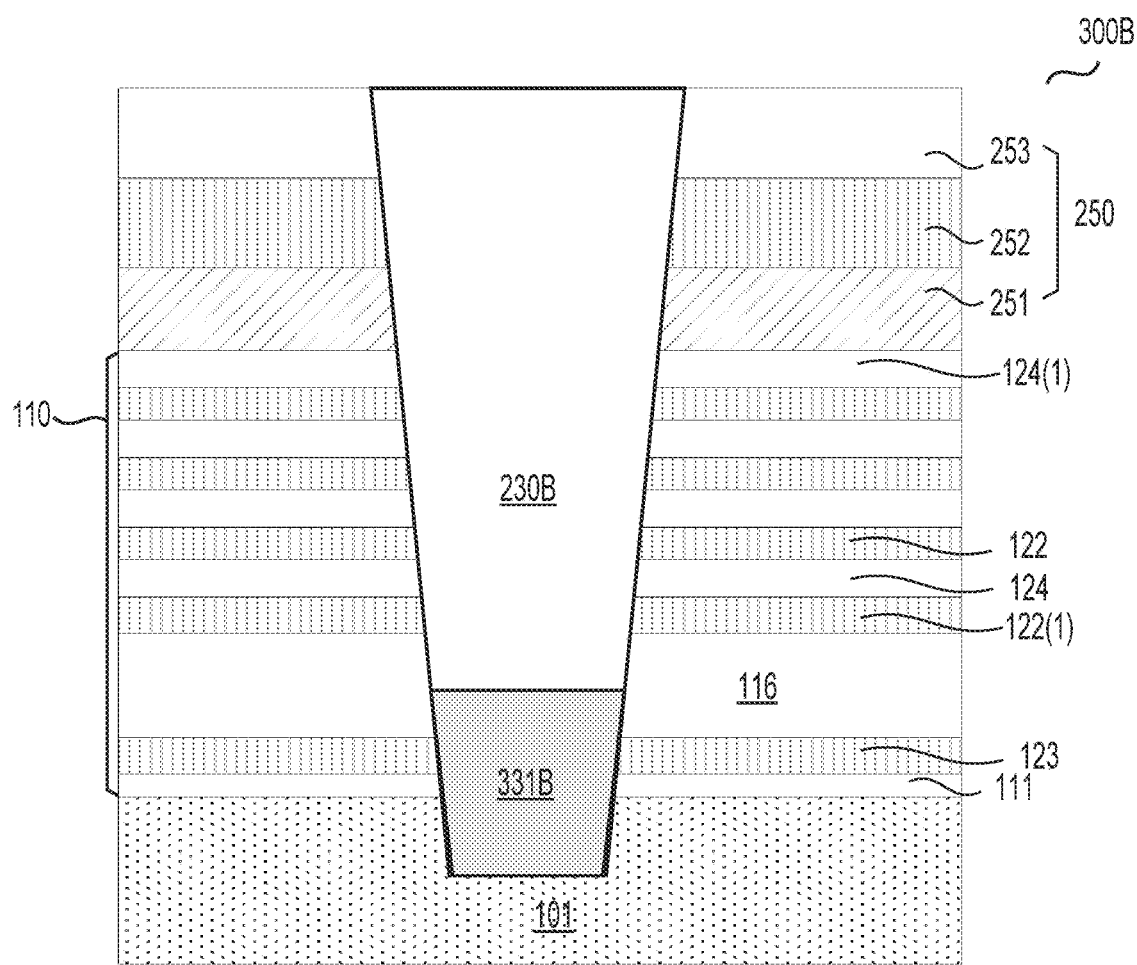

At step S1030 of the process 1000, gate dielectric layers are formed within the channel holes (e.g., 230A(1)-(4) or 230B(1)-(4)). Referring to FIGS. 4A and 4B, a contact layer is formed in the channel hole. In FIG. 4A, the contact layer 331A is formed in the channel hole 230A of the region 300A. In FIG. 4B, the contact layer 331B is formed in the channel hole 230B of the region 300B. The contact layer (e.g., 331A or 331B) can be formed using silicon deposited via a selective epitaxially growth technique. The contact layer (e.g., 331A or 331B) can include monocrystalline Si. In an example, the contact layer (e.g., 331A or 331B) has a thickness of 190 nm. An oxide layer, such as silicon oxide with a thickness of 2-5 nm, can subsequently be formed over the contact layer (e.g., 331A or 331B) by an oxidation process.

Figure 5A:
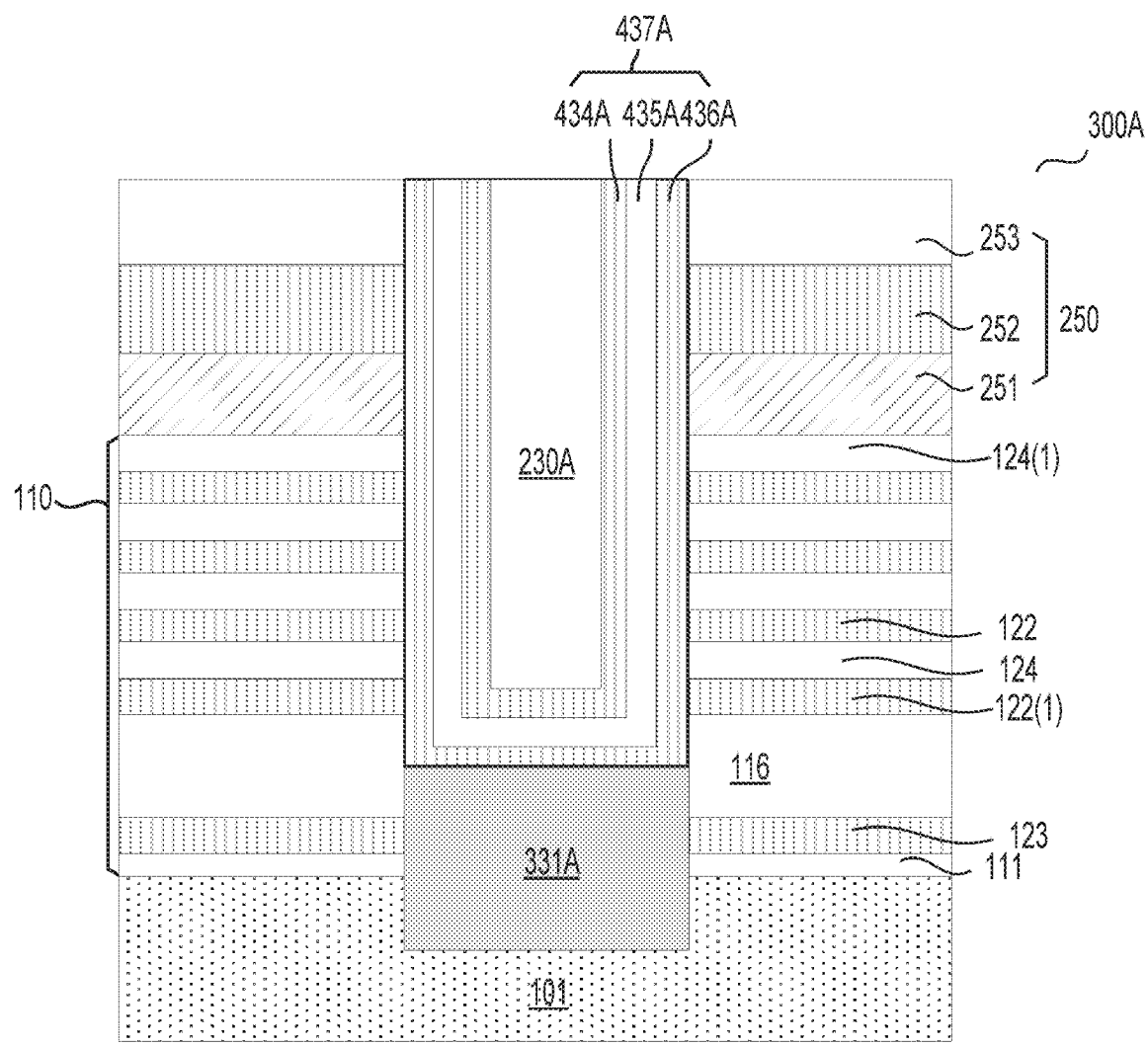

Subsequently, the gate dielectric layers are formed within the channel holes (e.g., 230A(1)-(4) or 230B(1)-(4)). Referring to FIG. 5A, the gate dielectric layer 437A is formed within the channel hole 230A. The gate dielectric layer 437A can be conformably formed by sequentially depositing the blocking insulating layer 436A, the charge storage layer 435A, and the tunneling insulating layer 434A in the channel hole 230A and above the contact layer 331A, respectively.

Figure 5B:
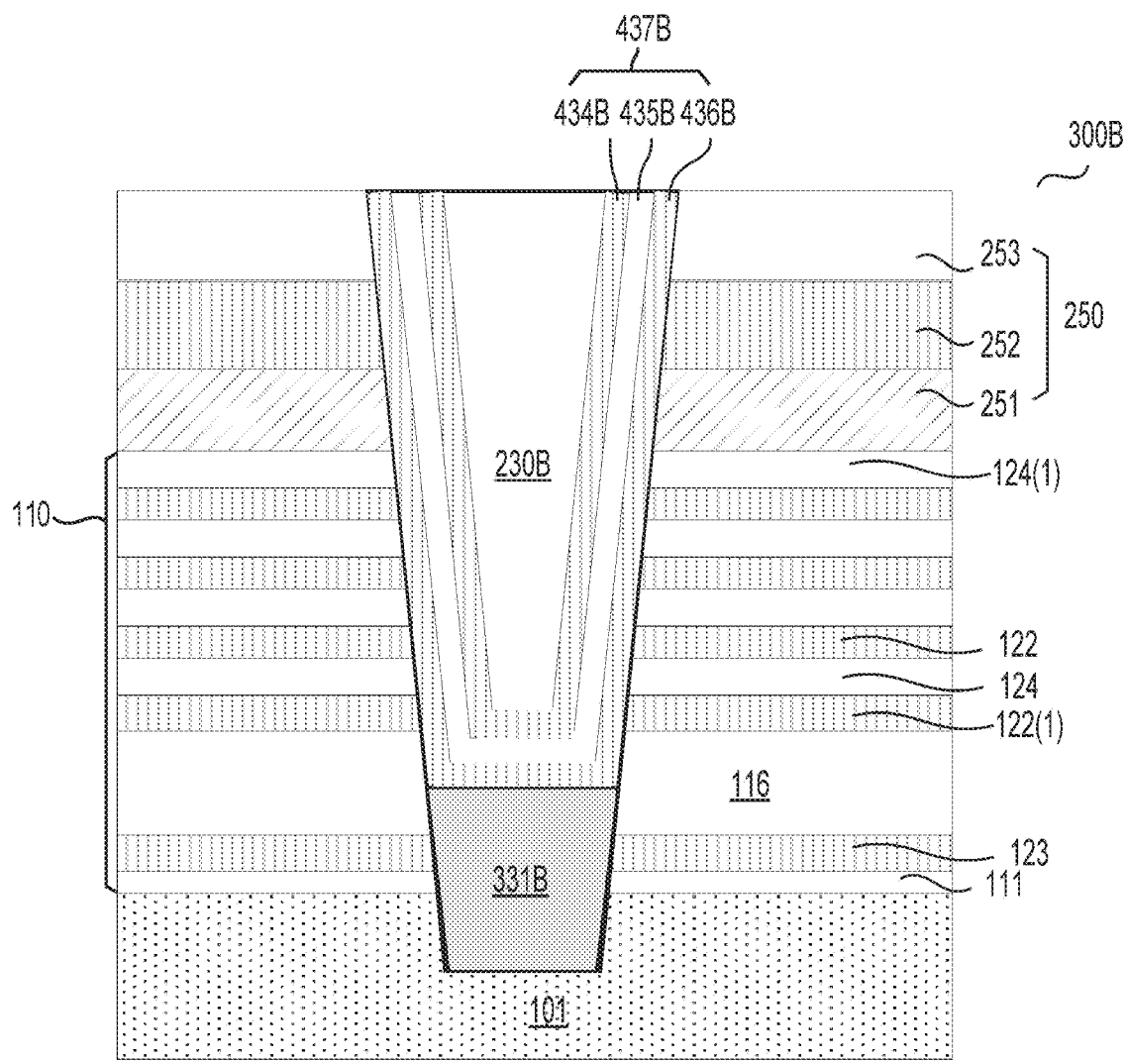

Referring to FIG. 5B, the gate dielectric layer 437B is formed within the channel hole 230B. The gate dielectric layer 437B can be conformably formed by sequentially depositing the blocking insulating layer 436B, the charge storage layer 435B, and the tunneling insulating layer 434B in the channel hole 230B and above the contact layer 331B, respectively.

The blocking insulating layer (e.g., 436A or 436B), the charge storage layer (e.g., 435A or 435B), and the tunneling insulating layer (e.g., 434A or 434B) can be formed using any suitable process, such as an ALD process, a CVD process, a PVD process, or a combination thereof.

The tunneling insulating layer (e.g., 434A or 434B) can be formed of $SiO_2$, $Si_3N_4$, SiON, $HfO_2$, $Al_2O_3$, and the like and have a thickness, for example, from 1 to 5 nm based on design requirements. The charge storage layer (e.g., 435A or 435B), for example, having a thickness from 3 to 10 nm, can be formed of silicon nitride, and may also include quantum dots or nanocrystals. The blocking insulating layer (e.g., 436A or 436B), for example, with a thickness ranging between 1 and 10 nm can include $SiO_2$, $HfO_2$, $ZrO_2$, $Al_2O_3$, tantalum oxide, a combination thereof, and the like.

In an example, the blocking insulating layer (e.g., 436A or 436B) includes $SiO_2$ formed by oxidizing a pre-formed silicon nitride layer via an in situ steam generation (ISSG) process, the charge storage layer (e.g., 435A or 435B) includes a multi-layer configuration formed by silicon nitride and silicon oxynitride, and the tunneling insulating layer (e.g., 434A or 434B) includes a multi-layer configuration formed by silicon oxide and silicon oxynitride. In an example, a thickness of the gate dielectric layer (e.g., 437A or 447B) can range from 5 to 25 nm according to design requirements.

Figure 6A:
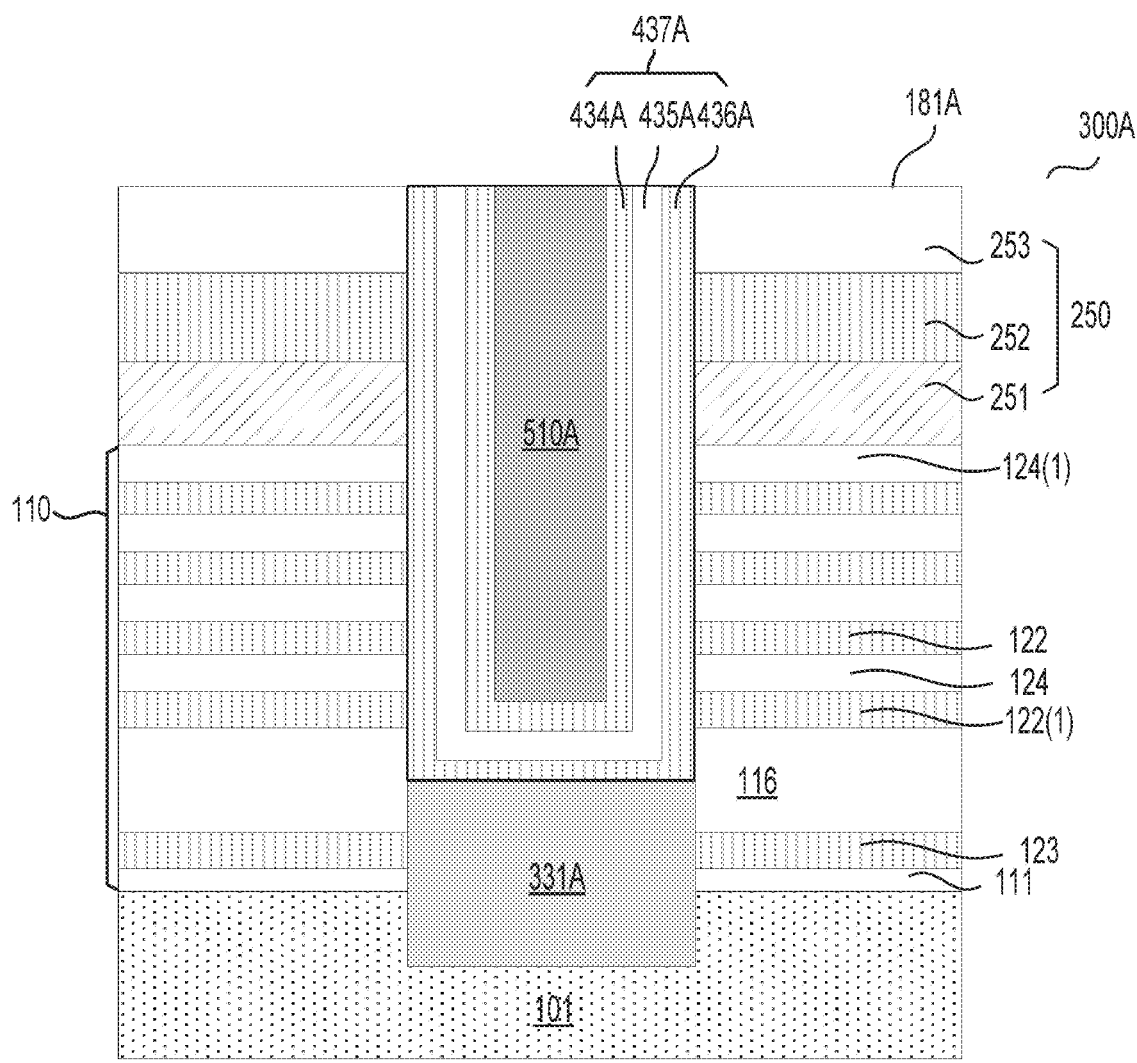
Figure 6B:
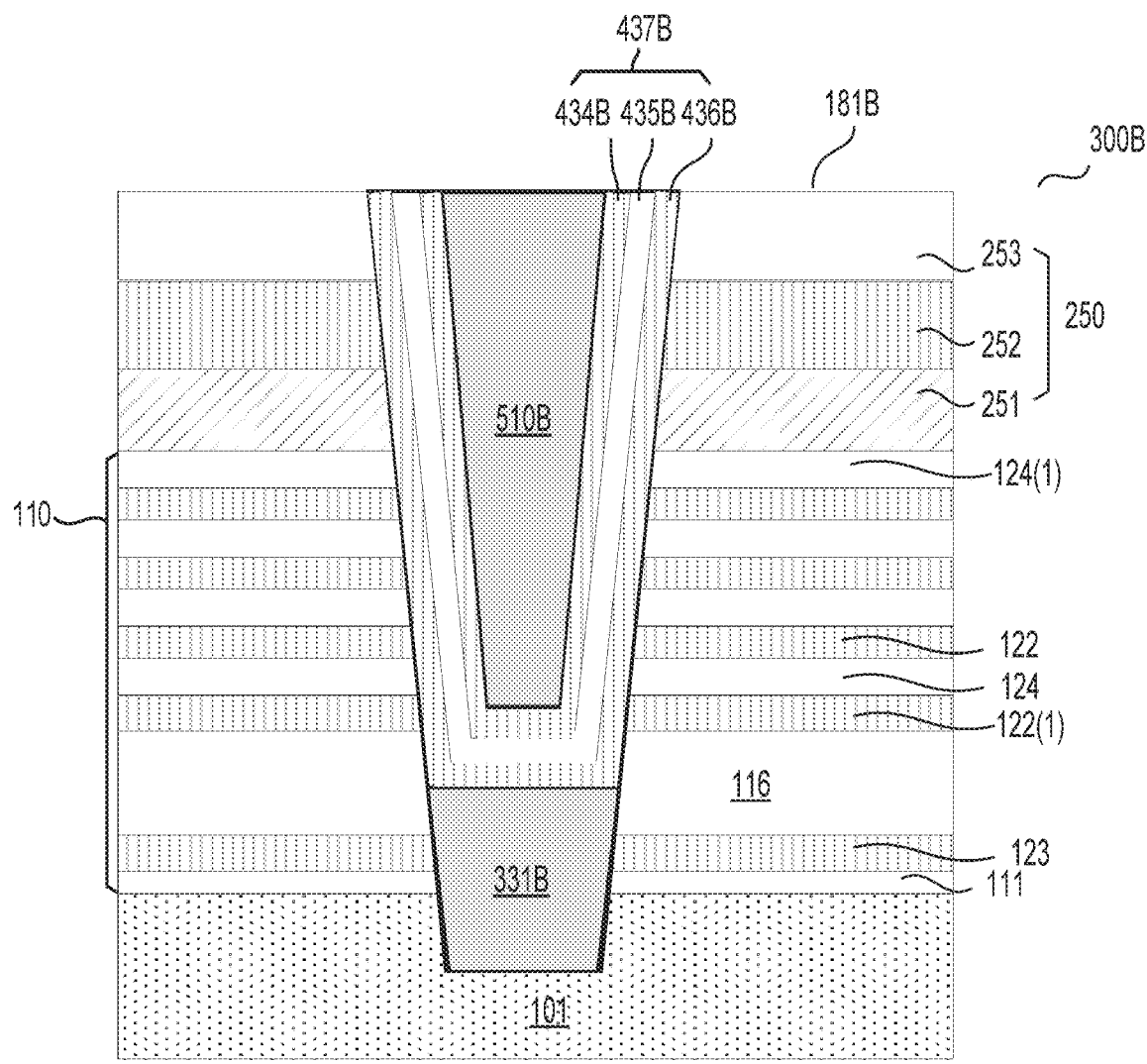

At step S1040 of the process 1000, channel layers can be formed in the channel holes. Referring to FIGS. 6A and 6B, the channel hole (e.g., 230A or 230B) is filled with a sacrificial layer (e.g., 510A in 230A or 510B in 230B). In the example shown in FIG. 5A, the channel hole 230A is completely filled by the sacrificial layer 510A. In some examples, the channel hole 230A is fully covered, however, is partially filled by the sacrificial layer 510A. In the example shown in FIG. 5B, the channel hole 230B is completely filled by the sacrificial layer 510B. In some examples, the channel hole 230B is fully covered, however, is partially filled by the sacrificial layer 510B.

In general, the sacrificial layer (e.g., 510A or 510B) can be conformably formed by depositing one or more sacrificial materials, such as polysilicon, tungsten, and/or the like, over the gate dielectric layer (e.g., 437A or 437B). The sacrificial layer (e.g., 510A or 510B) can be formed over a top surface (e.g., the surface 181A or the surface 181B) of the mask layer 250. The sacrificial layer (e.g., 510A or 510B) can be formed using any suitable process, such as an ALD process, a CVD process, a PVD process, or a combination thereof.

Figure 7A:
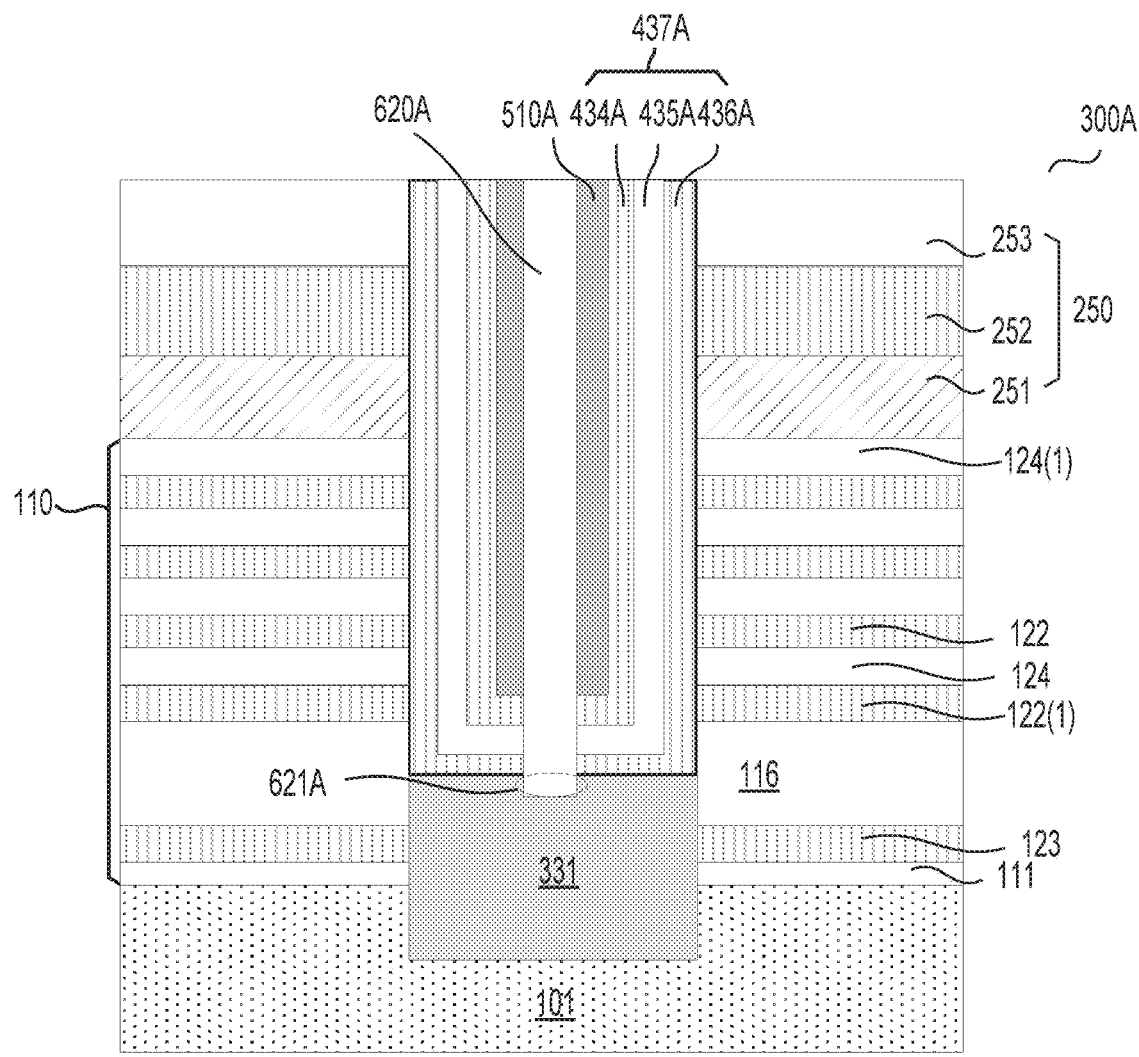
Figure 7B:
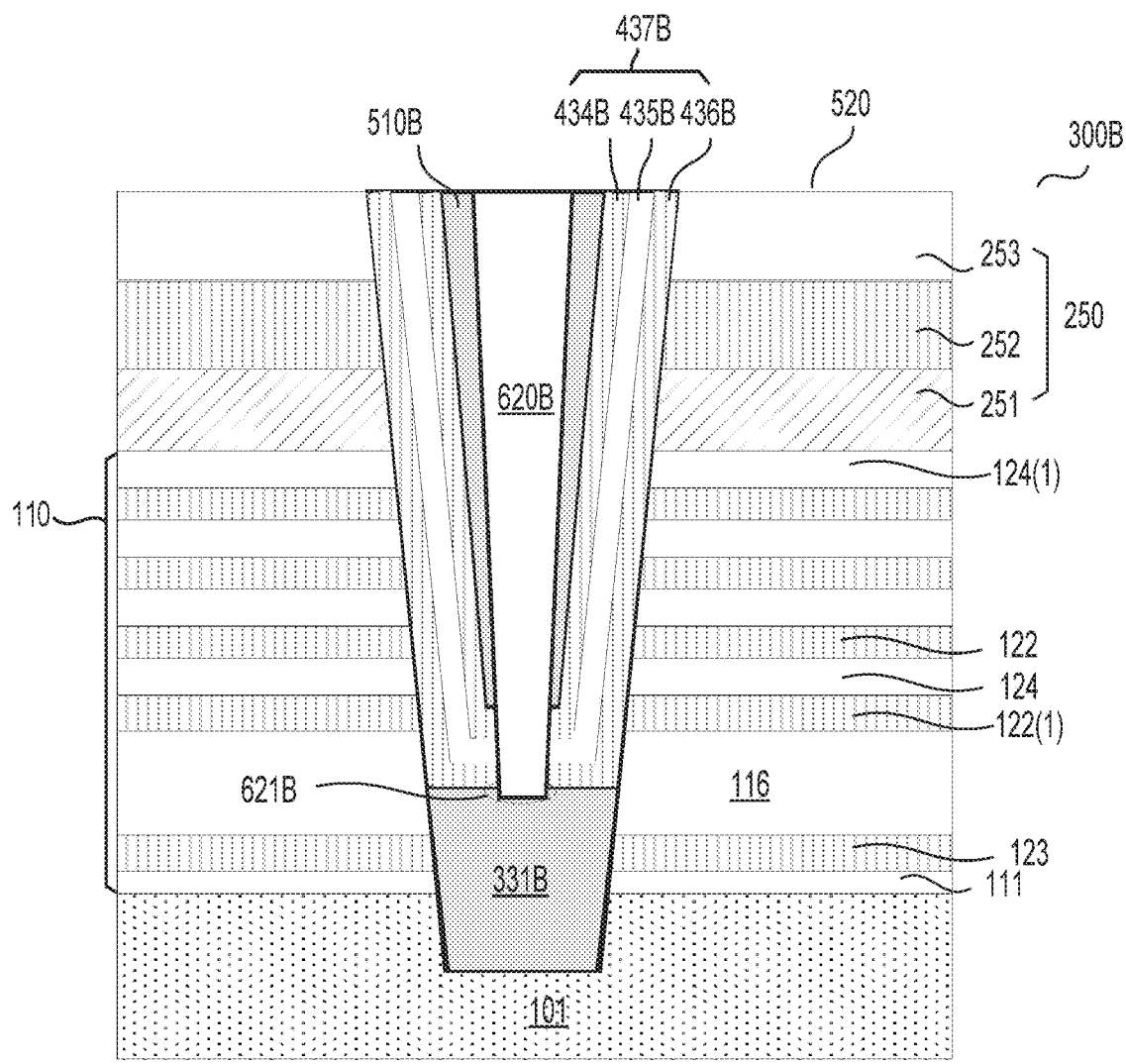

Referring to FIGS. 7A and 7B, a via (e.g., 620A or 620B) is formed in the channel hole (e.g., 230A or 230B) by removing portions of the gate dielectric layer (e.g., 437A or 437B) and the sacrificial layer (e.g., 510A or 510B) that are exposed by patterns of the mask layer 250. The via (e.g., 620A or 620B) can also include a portion (e.g., 621A or 621B) that is formed in the contact layer (e.g., 331A or 331B). The via (e.g., 620A or 620B) can be formed using an etching process, such as a dry etching.

Figure 8A:
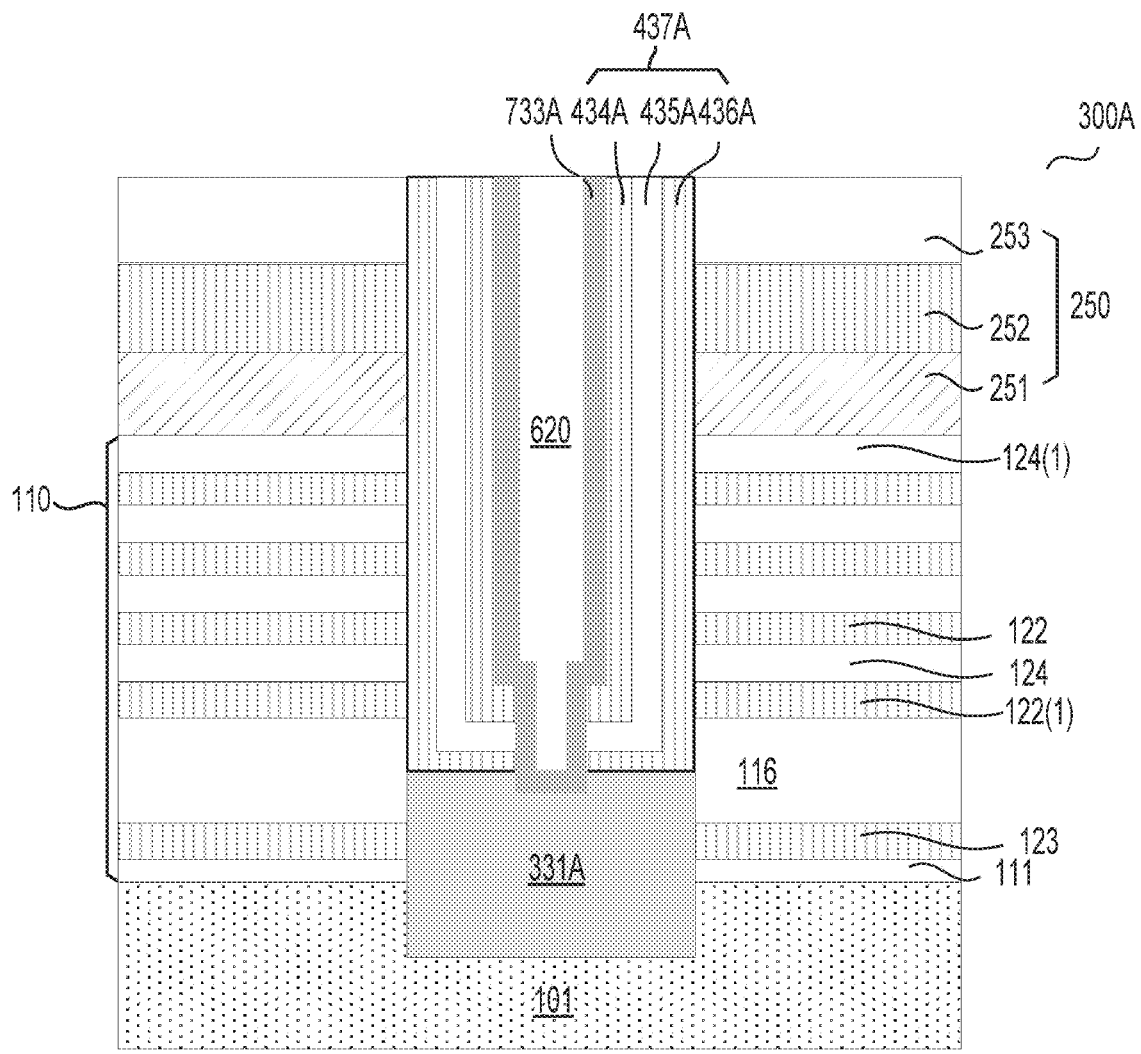
Figure 8B:
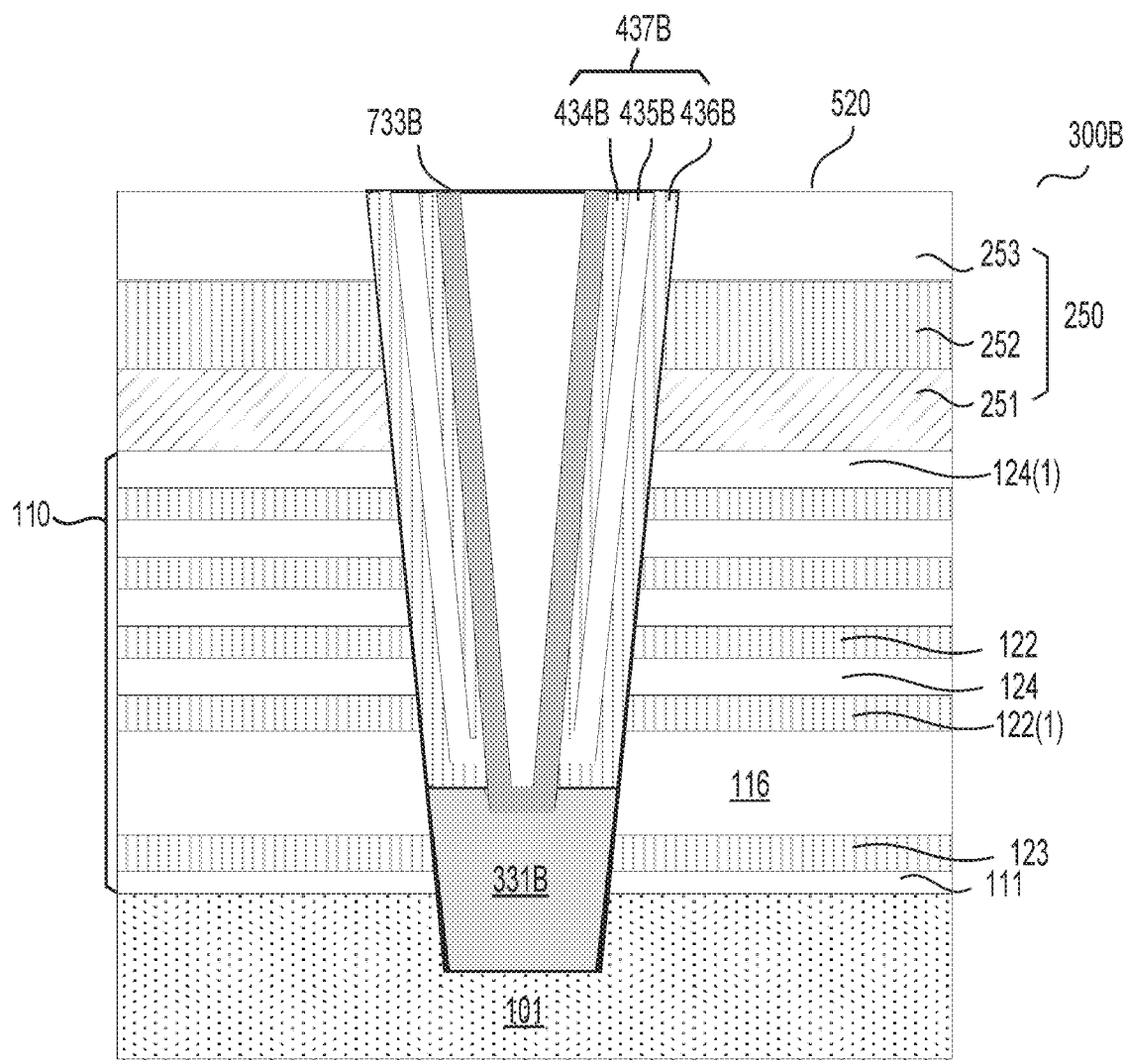

Referring to FIGS. 8A and 8B, the sacrificial layer (e.g., 510A or 510B) is removed from the channel hole (e.g., 230A or 230B) by an etching process, such as a wet etching, a dry etching, or a combination thereof. In an example, the etching process is a wet etching. The etching process can be selective to remove the sacrificial layer (e.g., 510A or 510B) and minimally affect the contact layer (e.g., 331A or 331B), the gate dielectric layer (e.g., 437A or 437B), the first and second layers 122 and 124, and the like, in the stack 110.

Further, one or more semiconductor materials can be deposited inside the channel hole (e.g., 230A or 230B) to form the channel layer (e.g., 733A or 733B) over the gate dielectric layer (e.g., 437A or 437B). The one or more semiconductor materials in the channel layer (e.g., 733A or 733B) can include intrinsic polysilicon, polysilicon doped with impurities, and the like. In an example, the one or more semiconductor materials includes a polysilicon layer deposited using a low pressure CVD process. Other suitable deposition process can also be applied to form the channel layer (e.g., 733A or 733B), such as PVD, ALD, or any combination thereof. The channel layer (e.g., 733A or 733B) can be conformably formed on the inner surface of the tunnel insulation layer (e.g., 434A or 434B) to have a thickness between 3 and 5 nm. In an example, the channel layer (e.g., 733A or 733B) is further annealed, for example, to improve quality of the polysilicon layer. Alternatively, the channel layer (e.g., 733A or 733B) can be annealed after a sacrificial layer (e.g., 820A or 820B) is formed, as shown in FIGS. 1D-1E. An annealing process including the deep penetration laser annealing method can be used as described with reference to FIGS. 1D-1E.

In various embodiments, such as described above with reference to FIGS. 1D-1E, the channel layer (e.g., 733A or 733B) has the first refractive index $n_1$, the tunnel insulating layer (e.g., 434A or 434B) has the second refractive index $n_2$, the charge storage layer (e.g., 435A or 435B) has the refractive index $n_4$, and the blocking insulating layer (e.g., 436A or 436B) has the refractive index $n_5$. According to an embodiment of the disclosure, the first refractive index $n_1$ of the channel layer (e.g., 733A or 733B) can be larger than the second refractive index $n_2$ of the tunnel insulating layer (e.g., 434A or 434B). In an example, the channel layer (e.g., 733A or 733B) is formed of polysilicon, and the first refractive index $n_1$ (e.g., the refractive index of polysilicon) is 4.14 at a wavelength at or near green light (e.g., 520 to 560 nm). The tunnel insulating layer (e.g., 434A or 434B) is formed of silicon oxide (e.g., $SiO_2$), and the second refractive index $n_2$ (e.g., the refractive index of $SiO_2$) is 1.47 at a wavelength at or near green light (e.g., 520 to 560 nm). In an example, the blocking insulating layer (e.g., 436A or 436B) formed of silicon oxide (e.g., $SiO_2$) and $n_5$ is equal to $n_2$ (e.g., 1.47). In an example, the charge storage layer (e.g., 435A or 435B) is formed of silicon nitride and $n_4$ (e.g., the refractive index of silicon nitride) is 2.057 at a wavelength at or near green light (e.g., 520 to 560 nm).

In some examples, sacrificial layers can be formed in the channel holes (e.g., 230A(1)-(4) or 230A(1)-(4)). Referring to FIGS. 9A-9B, the via (e.g., 620A or 620B) can be filled with the sacrificial layer (also referred to as the insulating layer) (e.g., 820A or 820B). In the example shown in FIG. 8A, the via 620A is completely filled by the sacrificial layer 820A. In some examples, the via 620A is fully covered, however, the via 620A is partially filled by the sacrificial layer 820A. In the example shown in FIG. 8B, the via 620B is completely filled by the sacrificial layer 820B. In some examples, the via 620B is fully covered, however, the via 620B is partially filled by the sacrificial layer 820B. The sacrificial layer (e.g., 820A or 820B) can include dielectric materials, such as $SiO_2$, one or more high-K materials, and the like.

The sacrificial layer (e.g., 820A or 820B) can have the refractive index $n_5$. In an example, the sacrificial layer (e.g., 820A or 820B) is formed of $SiO_2$, and the refractive index $n_3$ is the refractive index of $SiO_2$, such as 1.47 for a wavelength of green light (e.g., 520-560 nm). In an example, the second refractive index $n_2$ and the refractive index $n_3$ are identical and are 1.47 for a wavelength of green light (e.g., 520-560 nm). According to an embodiment of the disclosure, the first refractive index $n_1$ can be larger than the second refractive index $n_2$ and the refractive index $n_3$.

According to an embodiment of the disclosure, light incident onto the upper surface of the channel layer (e.g., 733A or 733B) can experience TIR inside the channel layer when the angle between the light before the light enters the semiconductor device 100 and the fiber axis of the channel layer (e.g., 733A or 733B) is within a certain range, as described above with reference to FIGS. 1D and 1E.

Referring back to FIG. 1D, when the incidence angle $\theta_{in}$ that is between the ray 193A and the fiber axis $C_{zA}$ of the channel layer 733A is less than the acceptance angle $\theta_a$, the rays 194A-196A experience TIR in the channel layer 733A. Referring back to FIG. 1E, when $\theta_S$ that is between the ray 193B and the fiber axis $C_{zB}$ of the channel layer 733B is less than $(90°-\theta_{C1})$ and $(90°-\theta_{C2})$, the rays 194B-196B experience TIR in the channel layer 733B where $\theta_{C1}$ is arcsin $(n_2/n_1)$ and the critical angle $\theta_{C2}$ is arcsin $(n_3/n_1)$. In an example, the refractive indices $n_2$ and $n_3$ are identical, thus when $\theta_S$ is less than $(90°-\theta_C)$, the rays 194B-196B experience TIR in the channel layer 733B.

Referring to FIGS. 1D, 1E, and 10, at S1050, an annealing process including the deep penetration laser annealing method can be performed on the channel layers in the respective channel holes (e.g., 230A(1)-(4) or 230B(1)-(4)) such that the laser light experiences TIR in the channel layers. At S1050, for the structure 170A shown in FIG. 1D, the angle (also the incidence angle $\theta_{in}$) between the laser light (e.g., indicated by the ray 193A) and the fiber axis $C_{zA}$ of the channel layer 733A is selected to be less than the acceptance angle $\theta_a$, and thus the laser light (e.g., indicated by the rays 194A-196A) experiences TIR in the channel layer 733A. Therefore, the laser light incident onto the upper of the channel layer 733A is concentrated within the channel layer 733A.

At S1050, for the structure 170B shown in FIG. 1E, the angle $\theta_S$ between the laser light (e.g., indicated by the ray 193B) and the fiber axis $C_{ZB}$ of the channel layer 733B is selected to be less than (90°−$\theta_{C1}$) and (90°−$\theta_{C2}$), and thus the laser light (e.g., indicated by the rays 194B-196B) experiences TIR in the channel layer 733B. Therefore, the laser light incident onto the upper surface of the channel layer 733B is concentrated within the channel layer 733B. In an example, the angle $\theta_S$ is selected to be less than 10°.

As described above, the structures 170A-170B can be fiber-like structures as follows. A material composition of the structures 170A-170B can be similar to a fiber where the first refractive index $n_1$ of the channel layer (e.g., 733A or 733B) is larger than the refractive indices $n_2$ and $n_3$ of the tunneling insulating layer (e.g., 434A or 434B) and the insulating layer (e.g., 820A or 820B), respectively. A shape of the structures 170A-170B is fiber-like where the structures 170A-170B are elongated along an axis (e.g., $C_{zA}$ or $C_{zB}$). For example, a length along the axis (e.g., $C_{zA}$ or $C_{zB}$) of the structures 170A-170B is 2 microns and the top width D1 the channel hole (e.g., 230B) is 0.1 microns, and an aspect ratio of the length over the top width is 20. Accordingly, under certain conditions, light traveling in the channel layer (e.g., 733A or 733B) experiences TIR, similar to light traveling in a core of a fiber. Accordingly, light traveling in the channel layer can be confined in the channel layer without exiting the interface between the channel layer (e.g., 733A or 733B) and the insulating layer (e.g., 820A or 820B) and without exiting the interface between the channel layer (e.g., 733A or 733B) and the tunneling insulating layer (e.g., 434A or 434B).

In an example, the structures 170A-170B differ from a fiber in that light is absorbed in the channel layer (e.g., 733A or 733B) in order to heat and then anneal the channel layer. Further, an absorption profile of the structures 170A-170B is such that the absorption coefficient of the channel layer (to be annealed) is significantly larger than absorption coefficients of other layers (e.g., the tunneling insulating layer 434A or 434B and the insulating layer 820A or 820B) that are adjacent to the channel layer. Therefore, light can predominantly be absorbed in the channel layer.

The laser annealing method, such as the deep penetration laser annealing method, described in the disclosure can be applied to other suitable structure(s) in the semiconductor device and is not limited to the structures 170A or 170B. For example, the deep penetration laser annealing method can be applied to one or more other structures that have one or more of the following properties: (i) has a material composition similar to that of the structures 170A-170B or a fiber; (ii) has a shape similar to that of the structures 170A-170B or a fiber; and (iii) an absorption profile similar to that of the structures 170A-170B. In an example, the deep penetration laser annealing method can be applied to heat (or anneal) a structure that has a material composition similar to that of the structures 170A-170B or a fiber where a refractive index of the structure is higher than a refractive index (or refractive indices) of an adjacent layer(s).

A wavelength of the laser light can be selected based on an absorption coefficient of the channel layer (e.g., 733A or 733B). In an example, a relatively larger absorption coefficient is selected so that an amount energy absorbed by the channel layer can increase a temperature in the channel layer for grains to be rearranged.

For example, polysilicon has a relatively larger absorption coefficient for the visible wavelengths covering a range from approximately 400 to 700 nm. The peak absorption coefficient lies in ultra violet (UV) wavelengths. A wavelength of the laser light can further be selected based on laser energy, cost effectiveness, and/or the like. According to an embodiment of the disclosure, green light or green laser light, for example, in a wavelength range of 520-560 nm, is selected where the absorption coefficient is relatively large and cost is relatively low. Alternatively, certain wavelengths shorter than the green wavelength can also be used, such as blue light, violet light, or UV light.

The deep penetration laser annealing method can be performed with the laser light having any suitable beam shape and any suitable beam size, such as a square beam shape (e.g., 1 mm×1 mm). In an example, the square beam shape has a more uniform energy distribution than an energy distribution of a line beam (or a line spot). The square beam shape can better resemble a shape of a chip (e.g., a memory chip including a 3D NAND memory device) than a shape of a circular beam, and thus can increase a temperature of the chip more uniformly. Further, the beam size of the square beam shape can be controlled so that the chip can be uniformly illuminated. In an example, the laser light is uniformly incident onto the semiconductor device 100, such as the upper surface (e.g., 181A or 181B). The rays shown in FIGS. 1D-1E are for illustration purposes and do not represent an actual energy distribution of the laser light on the upper surface (e.g., 181A or 181B).

In an embodiment, the wavelength is within the green wavelength range (e.g., 520-560 nm), an energy density is in a range of 0.5–1 J/cm$^2$, a beam size is 1 mm×1 mm (or a size that can cover an area of a chipset), and a pulse duration of 200 ns with a period of 1 ms. In an example, the size that can cover the area of the chipset is optimal.

In an embodiment, after the deep penetration laser annealing method, an average crystal size of polysilicon in the channel layer (e.g., 733A or 733B) can be larger than an average crystal size of a channel layer that is annealed by related technologies (e.g., RTA). For example, an average crystal size of polysilicon in a top portion of the channel layer (e.g., 733A or 733B) can increase at least 20%, such as 20% to 30%, compared to an average crystal size of a channel layer that is annealed by related technologies (e.g., RTA).

In an example, a conductivity in the channel layer (e.g., 733A or 733B) can be larger than a conductivity of a channel layer that is annealed by related technologies (e.g., RTA).

Figure 11A:
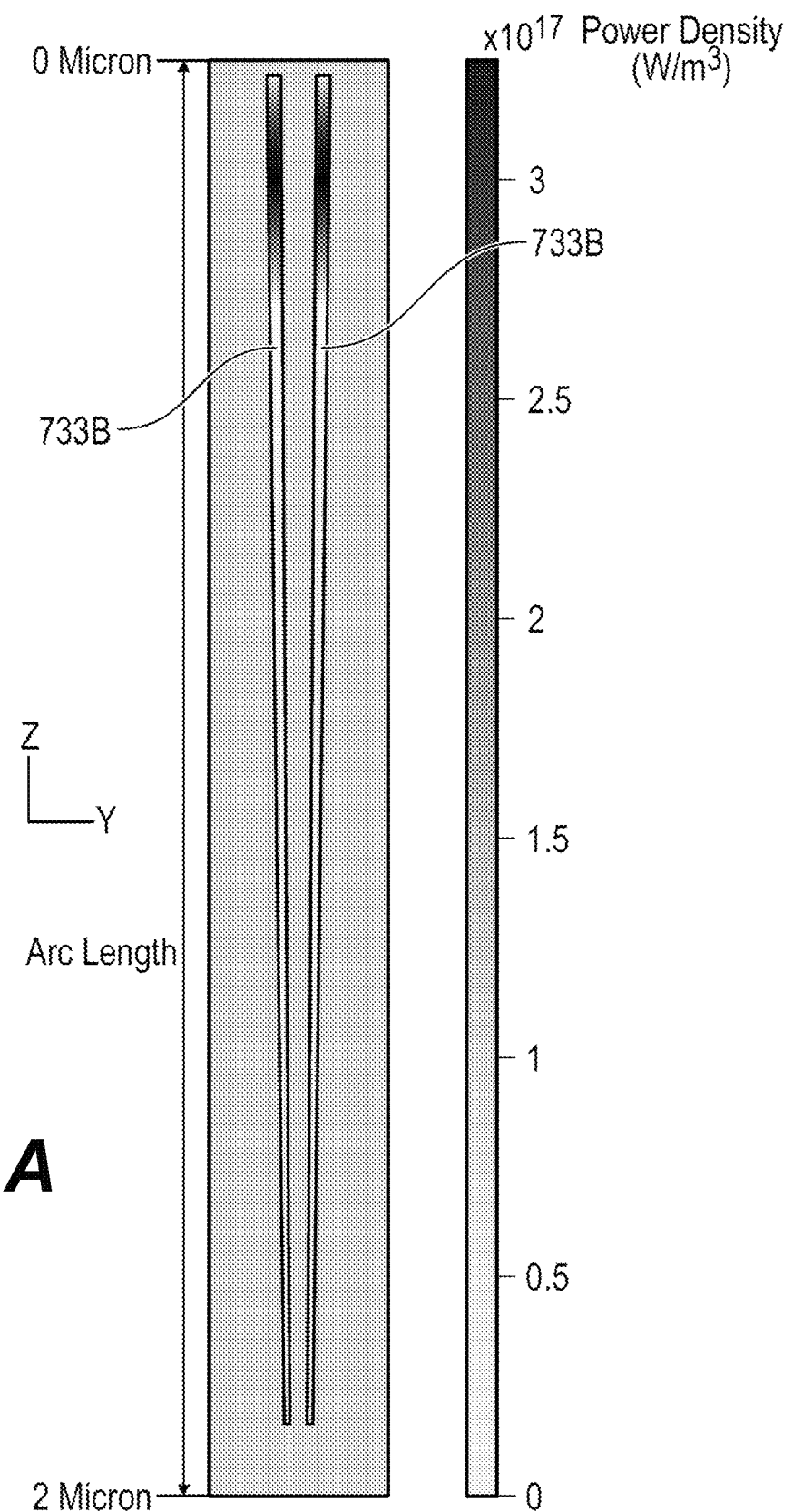
FIGS. 11A-11B show an example of a simulated power density distribution in a region of a semiconductor device according to an embodiment of the disclosure.
Figure 11B:
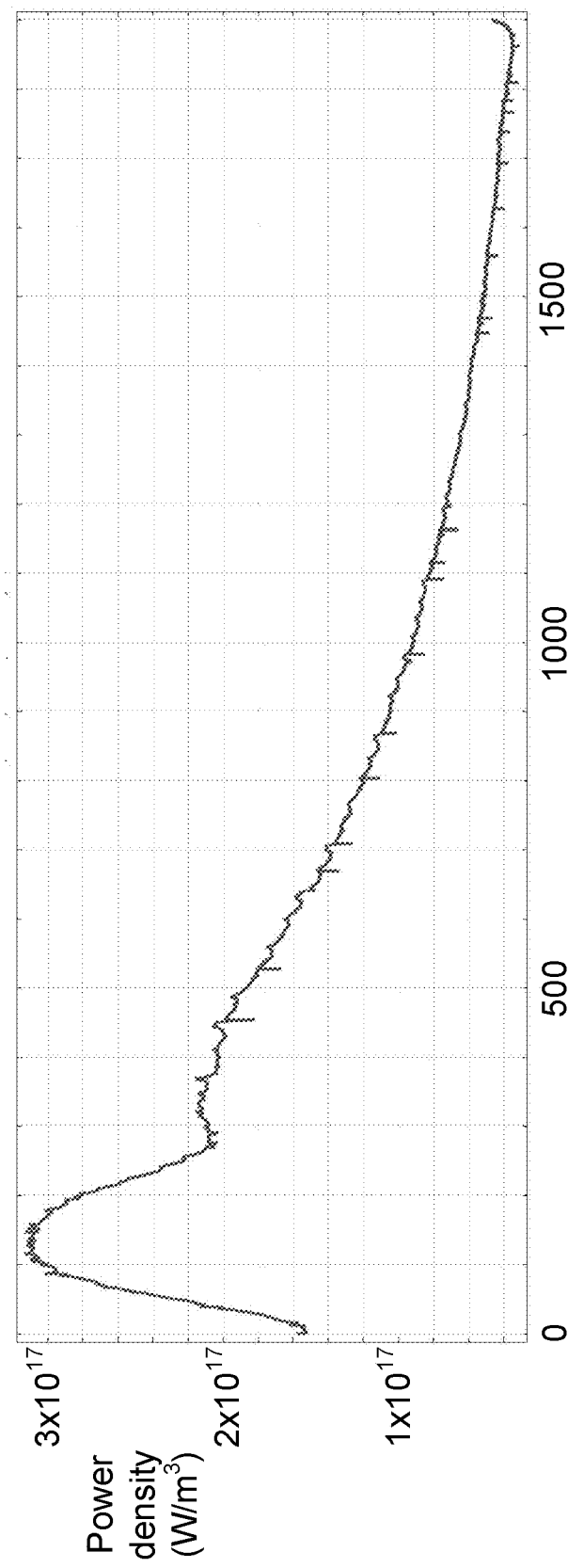

FIGS. 11A-11B show an exemplary simulated power density distribution in a region (e.g., the region 300B) of a semiconductor device according to an embodiment of the disclosure. An arc length (e.g., a length along the fiber axis $C_{ZB}$ of the channel layer 733B) is 1.9 microns. FIG. 11A shows a two-dimensional power density distribution in the ZY plane. FIG. 11B shows a one-dimensional power density distribution along the arc length (e.g., the fiber axis $C_{ZB}$ of the channel layer 733B).

FIG. 11A shows that the power density within the channel layer 733B can be significantly larger than the power density in other components in the region 300B. Thus, FIG. 11A shows that the laser light (indicated by the power density) can be concentrated within the channel layer 733B as a result of TIR.

FIG. 11B shows that the power density increases approximately within the first 150 nm and then decreases with the arc length. The increase of the power density within the first 150 nm can be explained as follows: for a location close to the 150 nm arc depth in the channel layer 733B, laser light experiencing TIR can reach the location. In addition, laser light initially incident onto the gate dielectric layer 437B or the insulating layer 820B can also reach the location, and thus increases the power density. For an arc length shallower than 150 nm, the contribution from the laser light initially incident onto the gate dielectric layer 437B or the insulating layer 820B is reduced. For an arc length deeper than 150 nm, absorption by the channel layer 733B can significantly reduce the power density with an increase of the arc length.

Figure 12A:
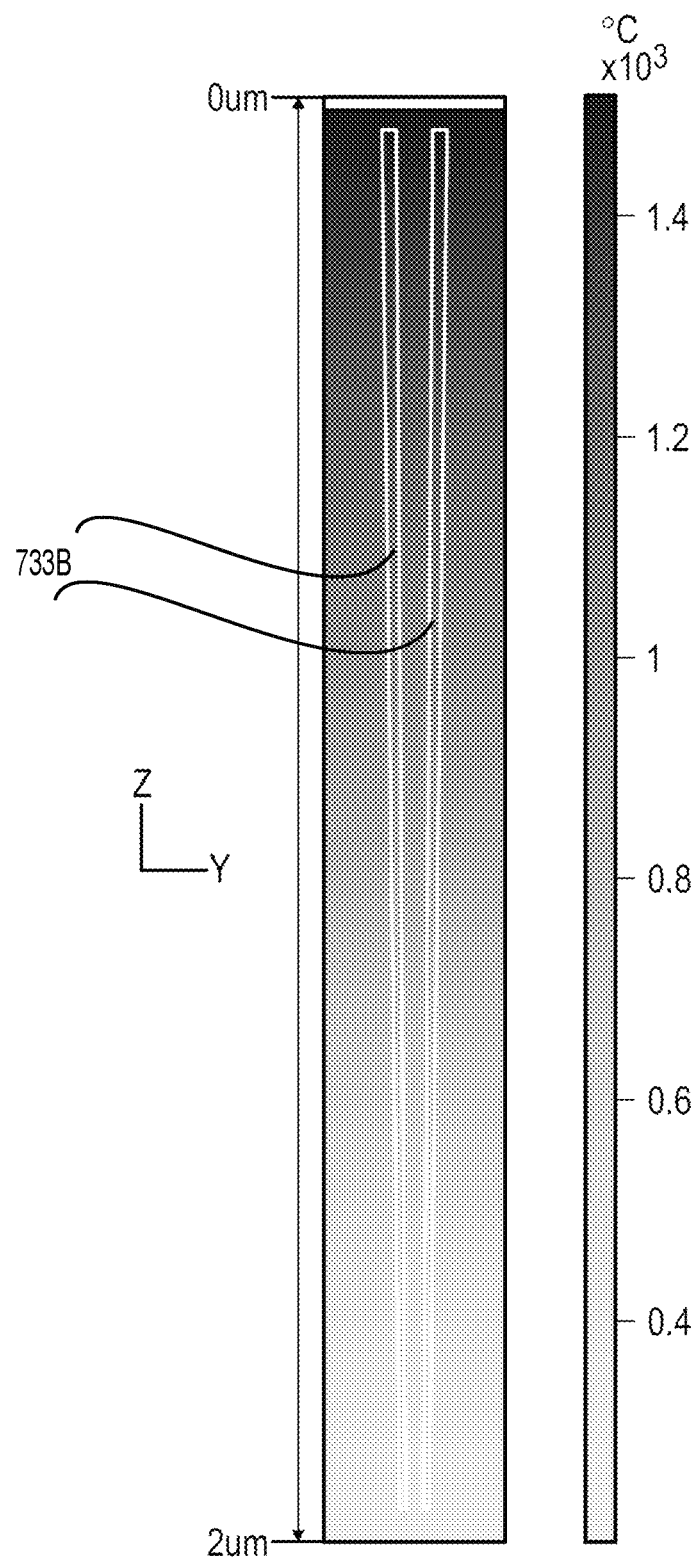
FIGS. 12A-12B show an example of a simulated temperature distribution in a region of a semiconductor device according to an embodiment of the disclosure.
Figure 12B:
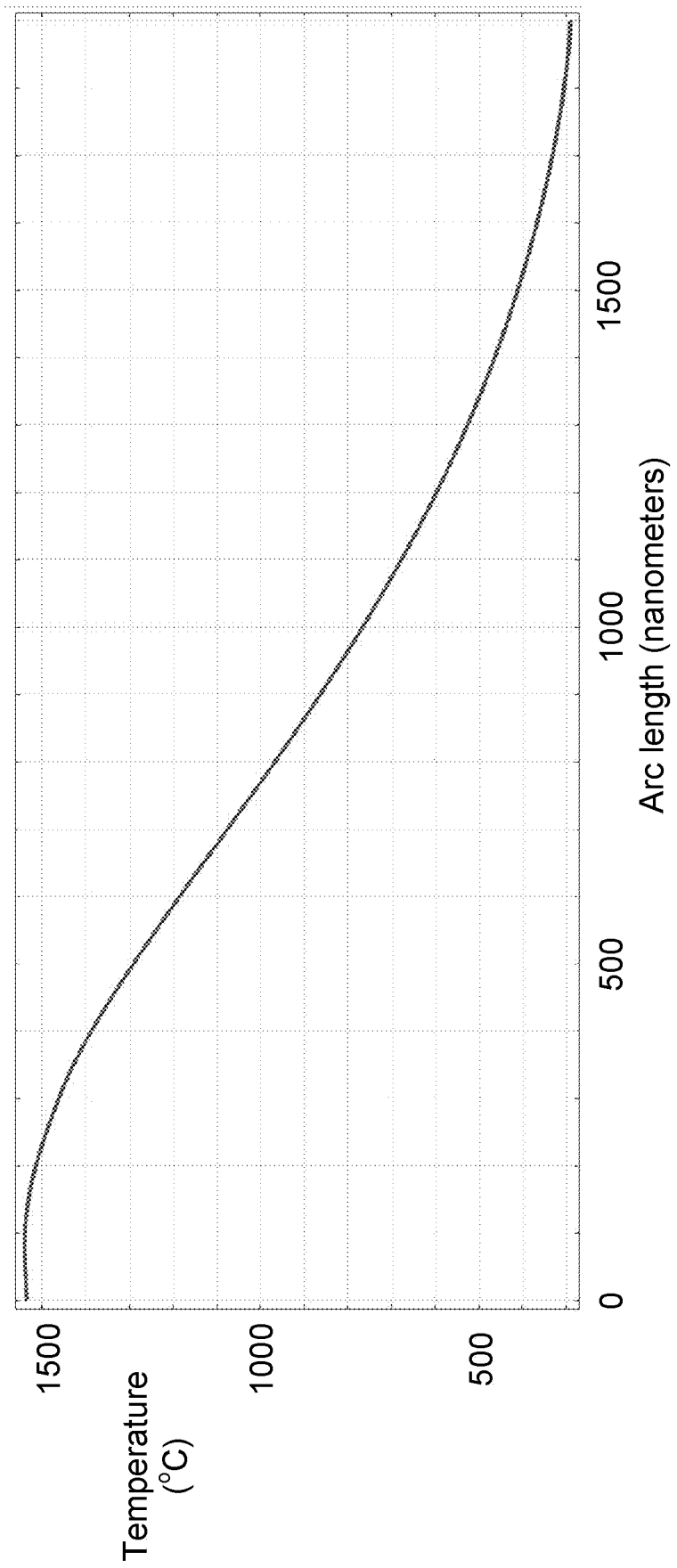

FIGS. 12A-12B show an exemplary simulated temperature distribution in a region (e.g., the region 300B) of a semiconductor device according to an embodiment of the disclosure. An arc length is 1.9 microns. FIG. 12A shows a two-dimensional temperature distribution in the ZY plane. FIG. 12B shows a one-dimensional temperature distribution along the arc length (e.g., the fiber axis $C_{ZB}$ of the channel layer 733B).

FIG. 12A shows that the temperature distribution can be relatively uniform within a plane that is parallel to the surface of the substrate.

FIGS. 12A and 12B show that the temperature is relatively flat within the top 150 nm and then decreases with the arc length. The temperature in the top 600 nm is approximately above 1200° C.

In an example, the power density distribution and the temperature distribution for the fiber-like structure 170B are similar to those shown in FIGS. 11A-11B and 12A-12B, respectively.

With the above power density distribution and the temperature distribution, an average crystal size of polysilicon in a top portion of the channel layer (e.g., 733A or 733B) can be larger than an average crystal size of polysilicon in a bottom portion of the channel layer (e.g., 733A or 733B).

In an example, after the deep penetration laser annealing method, the average crystal size of polysilicon in the top portion of the channel layer (e.g., 733A or 733B) can increase at least 20%, such as 20% to 30%, compared to the average crystal size of the bottom portion of the channel layer (e.g., 733A or 733B). Because of the increase of the average crystal size of polysilicon in the top portion of the channel layer (e.g., 733A or 733B), a conductivity of the top portion of the channel layer (e.g., 733A or 733B) can be larger than a conductivity of the bottom portion of the channel layer (e.g., 733A or 733B).

After the deep penetration laser annealing method, defects between grains in the channel layer (e.g., 733A or 733B) can be reduced significantly, such as by 50%, a distribution of grain sizes can be more uniform, and/or a single crystal can be formed at a top portion of the channel layer (e.g., 733A or 733B).

The gate structures can be subsequently formed. Referring to FIGS. 1D-1E, the second layers 122 and the layer 123 can be removed and replaced with the respective gate structures, thus forming transistors having the gate structures separated by insulating layers 124 that can electrically isolate the gate structures from each other.

Each of the gate structures can include dielectric material(s) and conductive material(s), such as a high dielectric constant (high-K) material (also referred to as a high-K layer) and a metal layer. The high-K layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The metal layer can include a metal having high conductivity, such as tungsten (W), copper (Cu), and the like. The gate structures can also include a glue layer that is disposed between the high-K layer and the metal layer. The glue layer can include refractory metals, such as titanium (Ti), tantalum (Ta) and their nitrides, such as TiN, TaN, W2N, TiSiN, TaSiN, and the like. The gate structures can have any suitable thicknesses according to desired characteristics of the semiconductor device 100. The thicknesses can range from 20 to 50 nm, such as 35 nm. Further, the thicknesses can be equal to one another or be different from one another. Then, the process 1000 proceeds to step S1099, and terminates.

Also additional steps can be provided before, during, and after the process 1000, and one or more of the steps described above can be replaced, eliminated, adapted, and/or performed in different order for additional embodiments of the process 1000. In an example, the deep penetration laser annealing method can be performed after forming the channel layer (e.g., 733A or 733B) and prior to forming the sacrificial layer (e.g., 820A or 820B). S1050 can be suitably adapted. For example, the refractive index $n_3$ can be 1 if air or nitrogen fills the via (e.g., 620A or 620B).

Various annealing processes can be used in combination to optimize the property (e.g., electrical conductivity, thermal conductivity, and/or the like) of the channel layer. The various annealing processes can be used in any suitable order. For example, the deep penetration laser annealing method such as shown in FIGS. 9A-9B and RTA are performed on the semiconductor device 100. In an example, a top portion (e.g., at least ⅓ of the channel layer) of the channel layer (e.g., 733A or 733B) is annealed due to the deep penetration laser annealing method and the RTA, and a bottom portion of the channel layer is mainly annealed by the RTA. Light absorption structure(s) can also be formed over the channel layer (e.g., 733A or 733B) after the deep penetration laser annealing method is performed.

Various additional interconnect structures (e.g., metallization layers having conductive lines and/or vias) may be formed over the semiconductor device 100. Such interconnect structures electrically connect the semiconductor device 100 with other contact structures and/or active devices to form functional circuits. Additional device features such as passivation layers, input/output structures, and the like may also be formed.

The process 1000 can be combined with other process flows to manufacture other suitable semiconductor components (not shown), such as other types of transistors, bipolar junction transistors, resistors, capacitors, inductors, diodes, fuses, and the like, on the semiconductor device 100. In various embodiments, the process 1000 can also be combined with additional process flows to manufacture other suitable circuits, for example, a peripheral circuit for driving the memory cells, a sense amplifier for reading data stored in the memory cells, a decoding circuit, and/or the like. The steps of the process 1000 are merely exemplary and are not intended to be limiting.

Figure 13:
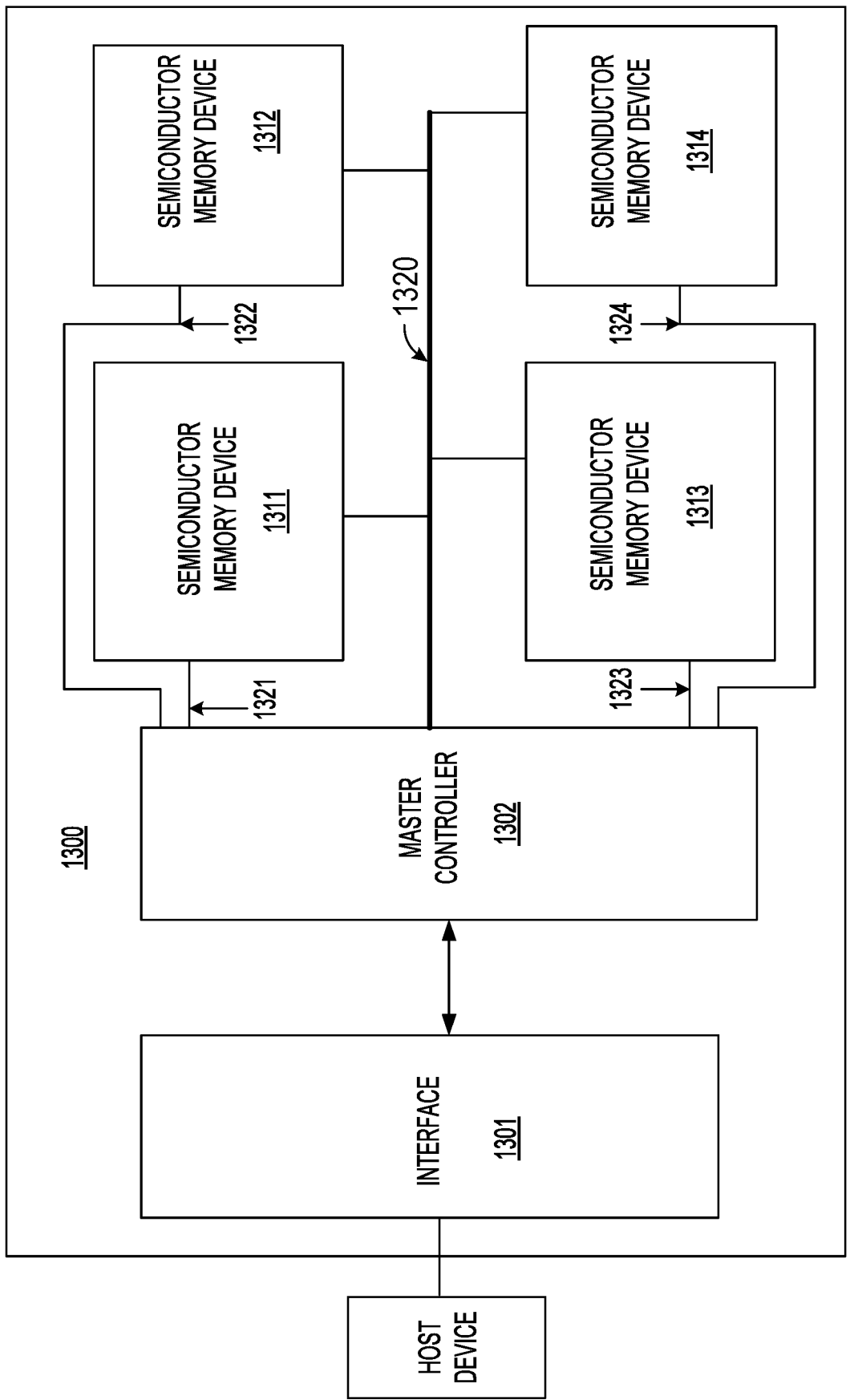
FIG. 13 shows a block diagram of a memory system device (or a memory system) 1300 according to some examples of the disclosure.

FIG. 13 shows a block diagram of a memory system device (or a memory system) 1300 according to some examples of the disclosure. The memory system device 1300 includes one or more semiconductor devices, such as shown by semiconductor devices 1311-1314, that are respectively configured similarly as the semiconductor device 100. In some examples, the semiconductor device 100 and the semiconductor devices 1311-1314 are semiconductor memory devices. In some examples, the memory system device 1300 is a solid state drive (SSD).

The memory system device 1300 includes other suitable components. In an example, the memory system device 1300 includes a controller or master controller 1302. For example, the memory system device 1300 includes an interface 1301 and the controller 1302 coupled together as shown in FIG. 13. The memory system device 1300 can include a bus 1320 that couples (e.g., connects) the master controller 1302 with the semiconductor devices 1311-1314. In addition, the master controller 1302 is connected with the semiconductor devices 1311-1314 respectively, such as shown by respective control lines 1321-1324.

The interface 1301 is suitably configured mechanically and electrically to connect between the memory system device 1300 and a host device, and can be used to transfer data between the memory system device 1300 and the host device.

The master controller 1302 is configured to connect the respective semiconductor devices 1311-1314 to the interface 1301 for data transfer. For example, the master controller 1302 is configured to provide enable/disable signals respectively to the semiconductor devices 1311-1314 to active one or more semiconductor devices 1111-1114 for data transfer.

The master controller 1302 is responsible for the completion of various instructions within the memory system device 1300. For example, the master controller 1302 can perform bad block management, error checking and correction, garbage collection, and the like.

In some embodiments, the master controller 1302 is implemented using a processor chip. In some examples, the master controller 1302 is implemented using multiple microcontroller units (MCUs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a channel hole in a stack including alternating first layers and second layers, the stack being formed over a substrate of the semiconductor device;
    forming a gate dielectric layer over an inner surface of the channel hole;
    forming a channel layer over an inner surface of the gate dielectric layer, the channel layer having an upper surface that is parallel to a surface of the substrate;
    performing laser annealing on the channel layer using laser light, wherein
    an incidence angle of the laser light on the upper surface of the channel layer causes a total internal reflection to occur at an interface between the channel layer and the gate dielectric layer and an interface between the channel layer and an insulating layer that is adjacent to the channel layer, the incidence angle being between the laser light and an axis perpendicular to the upper surface of the channel layer,
    wherein a distribution of crystal sizes in a top portion of the channel layer is more uniform than a distribution of crystal sizes in a bottom portion of the channel layer after the laser annealing is performed.

2. The method according to claim 1, wherein
    an inner surface of the channel layer and the axis perpendicular to the upper surface of the channel layer form a first angle, and
    the incidence angle of the laser light is determined based on the first angle, a first refractive index of the channel layer, a second refractive index of the gate dielectric layer, and a third refractive index of the insulating layer to cause the total internal reflection, the first refractive index being larger than the second refractive index and the third refractive index.

3. The method according to claim 2, wherein
    the first angle is zero, and the inner surface of the channel layer has a cylindrical shape, and
    the incidence angle is less than a threshold angle that is determined based on the first refractive index, the second refractive index, and the third refractive index.

4. The method according to claim 2, wherein
    the first angle is greater than zero, and the inner surface of the channel layer has a tapered cylindrical shape, and
    the incidence angle is zero.

5. The method according to claim 4, wherein the first angle is in a range of 0° to 10°.

6. The method according to claim 1, wherein
    a wavelength of the laser light is determined based on an absorption coefficient of the channel layer.

7. The method according to claim 6, wherein the wavelength is in a range of 520 to 560 nanometers (nm).

8. The method according to claim 1, wherein
    the gate dielectric layer includes a blocking insulating layer of silicon oxide, a charge storage layer of silicon nitride, and a tunneling insulating layer of silicon oxide that are sequentially formed over the inner surface of the channel hole,
    the channel layer includes polysilicon having a first refractive index,
    the tunneling insulating layer has a second refractive index,
    the insulating layer includes silicon oxide having a third refractive index, and
    the first refractive index is larger than the second refractive index and the third refractive index.

9. The method according to claim 1, wherein the performing comprises:
    performing the laser annealing with the laser light having a square beam shape.

10. The method according to claim 1, wherein
    the forming the channel layer includes depositing polysilicon over the inner surface of the gate dielectric layer; and
    the laser annealing is performed such that crystal sizes in a top portion of the channel layer increase 20% to 30%.

11. The method according to claim 1, further comprising:
    performing rapid thermal annealing on the semiconductor device.

12. The method according to claim 1, wherein monocrystalline Si is formed in a top portion of the channel layer after the laser annealing is performed.

13. A semiconductor device, comprising:
- a string of transistors disposed along a channel hole, the string of transistors being vertically stacked over a substrate along a vertical direction perpendicular to a surface of the substrate, the string of transistors including:
- a gate dielectric layer formed over an inner surface of the channel hole;
- a channel layer including polysilicon having a first refractive index formed over an inner surface of the gate dielectric layer, the channel layer having an upper surface that is parallel to the surface of the substrate, the first refractive index being larger than a second refractive index of the gate dielectric layer; and
- an insulating layer over an inner surface of the channel layer, the first refractive index being larger than a third refractive index of the insulating layer, wherein
- an average crystal size of polysilicon in a top portion of the channel layer is larger than an average crystal size of polysilicon in a bottom portion of the channel layer,
- wherein a distribution of crystal sizes in the top portion of the channel layer is more uniform than a distribution of crystal sizes in the bottom portion of the channel layer.

14. The semiconductor device according to claim 13, wherein the average crystal size of polysilicon in the top portion of the channel layer is at least 20% larger than the average crystal size of polysilicon in the bottom portion of the channel layer.

15. The semiconductor device according to claim 13, wherein a conductivity of the top portion of the channel layer is larger than a conductivity of the bottom portion of the channel layer.

16. The semiconductor device according to claim 13, wherein
- the inner surface of the channel layer has a cylindrical shape or a tapered cylindrical shape,
- the inner surface of the channel layer and an axis perpendicular to the upper surface of the channel layer form a first angle that is in a range of 0° to 10°.

17. The semiconductor device according to claim 13, wherein
- the gate dielectric layer includes a blocking insulating layer of silicon oxide, a charge storage layer of silicon nitride, and a tunneling insulating layer of silicon oxide that are sequentially formed over the inner surface of the channel hole,
- the insulating layer includes silicon oxide, and
- the second refractive index is of the tunneling insulating layer.

18. The semiconductor device according to claim 13, wherein monocrystalline Si is formed in the top portion of the channel layer.

19. A memory system, comprising:
- a controller that is connected to a semiconductor device, and
- the semiconductor device including:
  - a string of transistors disposed along a channel hole, the string of transistors being vertically stacked over a substrate of the semiconductor device along a vertical direction perpendicular to a surface of the substrate, the string of transistors including:
  - a gate dielectric layer formed over an inner surface of the channel hole;
  - a channel layer including polysilicon having a first refractive index formed over an inner surface of the gate dielectric layer, the channel layer having an upper surface that is parallel to the surface of the substrate, the first refractive index being larger than a second refractive index of the gate dielectric layer; and
  - an insulating layer over an inner surface of the channel layer, the first refractive index being larger than a third refractive index of the insulating layer, wherein
  - an average crystal size of polysilicon in a top portion of the channel layer is larger than an average crystal size of polysilicon in a bottom portion of the channel layer,
  - wherein a distribution of crystal sizes in the top portion of the channel layer is more uniform than a distribution of crystal sizes in the bottom portion of the channel layer.

* * * * *